(12) United States Patent
Tanaka

(10) Patent No.: US 7,719,017 B2
(45) Date of Patent: May 18, 2010

(54) SEMICONDUCTOR LIGHT-EMITTING DEVICE AND ITS MANUFACTURING METHOD

(75) Inventor: Akimasa Tanaka, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 52 days.

(21) Appl. No.: 10/585,314

(22) PCT Filed: Dec. 27, 2004

(86) PCT No.: PCT/JP2004/019566

§ 371 (c)(1),
(2), (4) Date: May 3, 2007

(87) PCT Pub. No.: WO2005/067113

PCT Pub. Date: Jul. 21, 2005

(65) Prior Publication Data

US 2007/0241354 A1    Oct. 18, 2007

(30) Foreign Application Priority Data

Jan. 7, 2004  (JP)  ............................. 2004-002318

(51) Int. Cl.
*H01L 33/00* (2006.01)
(52) U.S. Cl. .................. 257/98; 257/E33.069
(58) Field of Classification Search ........... 257/79–103, 257/E33.068, E33.069
See application file for complete search history.

(56) References Cited

U.S. PATENT DOCUMENTS

| 4,956,683 A | * | 9/1990 | Quintana ..................... 257/93 |
| 5,373,520 A | | 12/1994 | Shoji et al. |
| 5,376,580 A | | 12/1994 | Kish et al. |
| 5,696,389 A | | 12/1997 | Ishikawa et al. |
| 5,724,376 A | * | 3/1998 | Kish et al. .................... 372/96 |
| 5,837,561 A | | 11/1998 | Kish, Jr. et al. |
| 6,282,219 B1 | | 8/2001 | Butler et al. |
| 2002/0053872 A1 | * | 5/2002 | Yang et al. .................. 313/506 |
| 2002/0137245 A1 | | 9/2002 | Kitamura et al. |
| 2003/0047737 A1 | | 3/2003 | Lin et al. |
| 2004/0012028 A1 | | 1/2004 | Park et al. |
| 2004/0016932 A1 | | 1/2004 | Kondo |
| 2004/0188789 A1 | | 9/2004 | Koyama et al. |
| 2005/0018741 A1 | | 1/2005 | Nomaguchi |
| 2007/0241354 A1 | | 10/2007 | Tanaka |
| 2008/0031295 A1 | | 2/2008 | Tanaka |

FOREIGN PATENT DOCUMENTS

| EP | 1 160 891 | 12/2001 |
| JP | 02-128481 | 5/1990 |
| JP | 06-326353 | 11/1994 |
| JP | 7-170027 | 7/1995 |

(Continued)

*Primary Examiner*—Sue Purvis
*Assistant Examiner*—Kevin Quinto
(74) *Attorney, Agent, or Firm*—Drinker Biddle & Reath LLP

(57) ABSTRACT

A semiconductor light-emitting device comprises a multi-layer structure and a glass substrate. The multilayer structure includes a plurality of laminated compound semiconductor layers and generates light. The multilayer structure has a light exit face for emitting the generated light, whereas the glass substrate optically transparent to the light is bonded to the light exit face by a film made of silicon oxide.

6 Claims, 19 Drawing Sheets

| | FOREIGN PATENT DOCUMENTS | |
|---|---|---|
| JP | 08-111559 | 4/1996 |
| JP | 08-255933 | 10/1996 |
| JP | 9-293893 | 11/1997 |
| JP | 10-200200 | 7/1998 |
| JP | 11-046038 | 2/1999 |
| JP | 11-154774 | 6/1999 |
| JP | 11-168262 | 6/1999 |
| JP | 2002-015873 | 1/2002 |
| JP | 2002-158373 | 5/2002 |
| JP | 2002-185071 | 6/2002 |
| JP | 2002-280614 | 9/2002 |
| JP | 2002-353564 | 12/2002 |
| JP | 2002-368334 | 12/2002 |
| JP | 2003-273463 | 9/2003 |
| WO | WO 02/41406 A1 * | 5/2002 |

* cited by examiner

SEMICONDUCTOR LIGHT-EMITTING DEVICE AND ITS MANUFACTURING METHOD

TECHNICAL FIELD

The present invention relates to a semiconductor light-emitting device and a method of manufacturing the same.

BACKGROUND ART

Recently, as CPUs have been driven at a higher frequency (e.g., 10 GHz or higher), attention has been focused on optical interconnection techniques which transmit signals within and between system apparatus by light. Optical semiconductor devices such as semiconductor photodetecting devices and semiconductor light-emitting devices are used in the optical interconnection techniques.

Japanese Patent Application Laid-Open Nos. HEI 2-128481, HEI 10-200200, and HEI 11-46038 disclose semiconductor light-emitting devices of so-called back emission type each comprising a substrate and a plurality of compound semiconductor layers laminated on one principal surface of the substrate, while light is emitted from the other principal surface of the substrate. For the following purposes, the part of substrate positioned under the light-emitting region is partially thinned and is surrounded by a part maintaining the thickness of the substrate. The first purpose is to prevent optical signals from deteriorating or disappearing because of optical absorption of the substrate. The second purpose is to prevent the semiconductor devices from being damaged or broken when mounted onto an external board by wire-bonding or bump-bonding.

Since the part maintaining the substrate thickness exists, however, there is a limit to the minimal size of the above-mentioned semiconductor light-emitting devices. In particular, when forming a light-emitting device array by arranging a plurality of light-emitting parts a row, the pitch between the light-emitting parts is hard to narrow, which inevitably increases the size of the light-emitting device array.

DISCLOSURE OF THE INVENTION

It is an object of the present invention to provide a semiconductor light-emitting device which has a sufficient mechanical strength and can be made small, and to provide a method of manufacturing the same.

In one aspect, the present invention relates to a semiconductor light-emitting device comprising a multilayer structure. The multilayer structure includes a plurality of compound semiconductor layers laminated and generates light. The multilayer structure has a light exit face for emitting the generated light. A glass substrate optically transparent to the light is fixed to the light exit face by way of a film made of silicon oxide.

The multilayer structure may include a first distributed Bragg reflector (DBR) layer of a first conductive type, a first cladding layer of the first conductive type, an active layer, a second cladding layer of a second conductive type, and a second DBR layer of the second conductive type sequentially laminated as the plurality of compound semiconductor layers. The multilayer structure may have a multilayer region partially including the first DBR layer, first cladding layer, active layer, second cladding layer, and second DBR layer; and an insulated or semi-insulated current-narrowing region surrounding the multilayer region. The first DBR layer may be arranged between the first cladding layer and the film made of silicon oxide.

The multilayer structure may further comprise a contact layer of the first conductive type positioned between the film made of silicon oxide and the first DBR layer.

The multilayer structure may have a light-emitting part including the multilayer region and a pad electrode mounting part partially including the first DBR layer, first cladding layer, active layer, second cladding layer, and second DBR layer. The semiconductor light-emitting device may further comprise a first pad electrode arranged on the light-emitting part and electrically connected to the multilayer region, and a second pad electrode arranged on the pad electrode mounting part and electrically connected to the contact layer.

The second pad electrode may be electrically connected to the contact layer through an opening formed between the light-emitting part and the pad electrode mounting part. The semiconductor light-emitting device may further comprise respective bump electrodes arranged on the first and second pad electrodes.

The multilayer structure may have a plurality of the arranged light-emitting parts.

The semiconductor light-emitting device may further comprise a light-reflecting film disposed on the second DBR layer, the light-reflecting film covering the multilayer region.

The glass substrate may have front and rear faces, the front face of the glass substrate may be in contact with the film made of silicon oxide, the rear face of the glass substrate may have a lens part for receiving the light emitted from the multilayer structure. The lens part may be depressed from the lowermost surface of the glass substrate.

In another aspect, the present invention relates to a method of manufacturing a semiconductor light-emitting device having a multilayer structure. The multilayer structure includes a plurality of compound semiconductor layers laminated and generates light. The method in accordance with the present invention comprises preparing a semiconductor substrate and a glass substrate, the semiconductor substrate having front and rear faces, the glass substrate having front and rear faces and being optically transparent to the generated light; forming the multilayer structure on the front face of the semiconductor substrate; forming a film made of silicon oxide on the multilayer structure; fixing the multilayer structure onto the glass substrate by fusing the film made of silicon oxide onto the front face of the glass substrate; and removing the semiconductor substrate while keeping the multilayer structure fixed to the glass substrate.

The removing the semiconductor substrate may include removing the semiconductor substrate by wet etching.

The method may further comprise: before the forming the multilayer structure, forming an etching stop layer for stopping the wet etching so that the etching stop layer is arranged between the semiconductor substrate and multilayer structure, and after the removing the semiconductor substrate, removing the etching stop layer by wet etching.

The multilayer structure may include a first distributed Bragg reflector (DBR) layer of a first conductive type, a first cladding layer of the first conductive type, an active layer, a second cladding layer of a second conductive type, and a second DBR layer of the second conductive type as the plurality of compound semiconductor layers. The forming the multilayer structure may include sequentially laminating the second DBR layer, second cladding layer, active layer, first cladding layer, and first DBR layer on the front face of the semiconductor substrate.

The forming the multilayer structure may further include forming a contact layer of the first conductive type positioned on the topmost portion of the multilayer structure after laminating the first DBR layer.

The method may further comprise: after the removing the semiconductor substrate, forming an insulated or semi-insulated current-narrowing region in the multilayer structure, the current-narrowing region surrounding a multilayer region partially including the first DBR layer, first cladding layer, active layer, second cladding layer, and second DBR layer; forming a light-emitting part and a pad electrode mounting part, the light-emitting part including the multilayer region, the pad electrode mounting part partially including the first DBR layer, first cladding layer, active layer, second cladding layer, and second DBR layer; and forming a first pad electrode on the light-emitting part to electrically connect the first pad electrode to the multilayer region and forming a second pad electrode on the pad electrode mounting part to electrically connect the second pad electrode to the contact layer.

The forming the light-emitting part and the pad electrode mounting part may include forming an opening between the light-emitting part and the pad electrode mounting part. The electrically connecting the second pad electrode to the contact layer may include electrically connecting the second pad electrode to the contact layer through the opening.

The method in accordance with the present invention may further comprise forming a light-reflecting film covering the multilayer region on the second DBR layer.

The rear face of the glass substrate may have a lens part for receiving the light emitted from the multilayer structure. The lens part may be depressed from the lowermost surface of the glass substrate.

The above-mentioned and other objects and novel features of the invention will be more fully apparent from the following description and the accompanying drawings. However, the drawings are only illustrative and are not intended to limit the scope of the invention.

BEST MODES FOR CARRYING OUT THE INVENTION

Semiconductor light-emitting devices in accordance with embodiments of the present invention will now be described with reference to the drawings. Identical symbols are used for identical elements or elements having identical functions, and these elements will not be explained repeatedly.

First Embodiment

Figure 1:
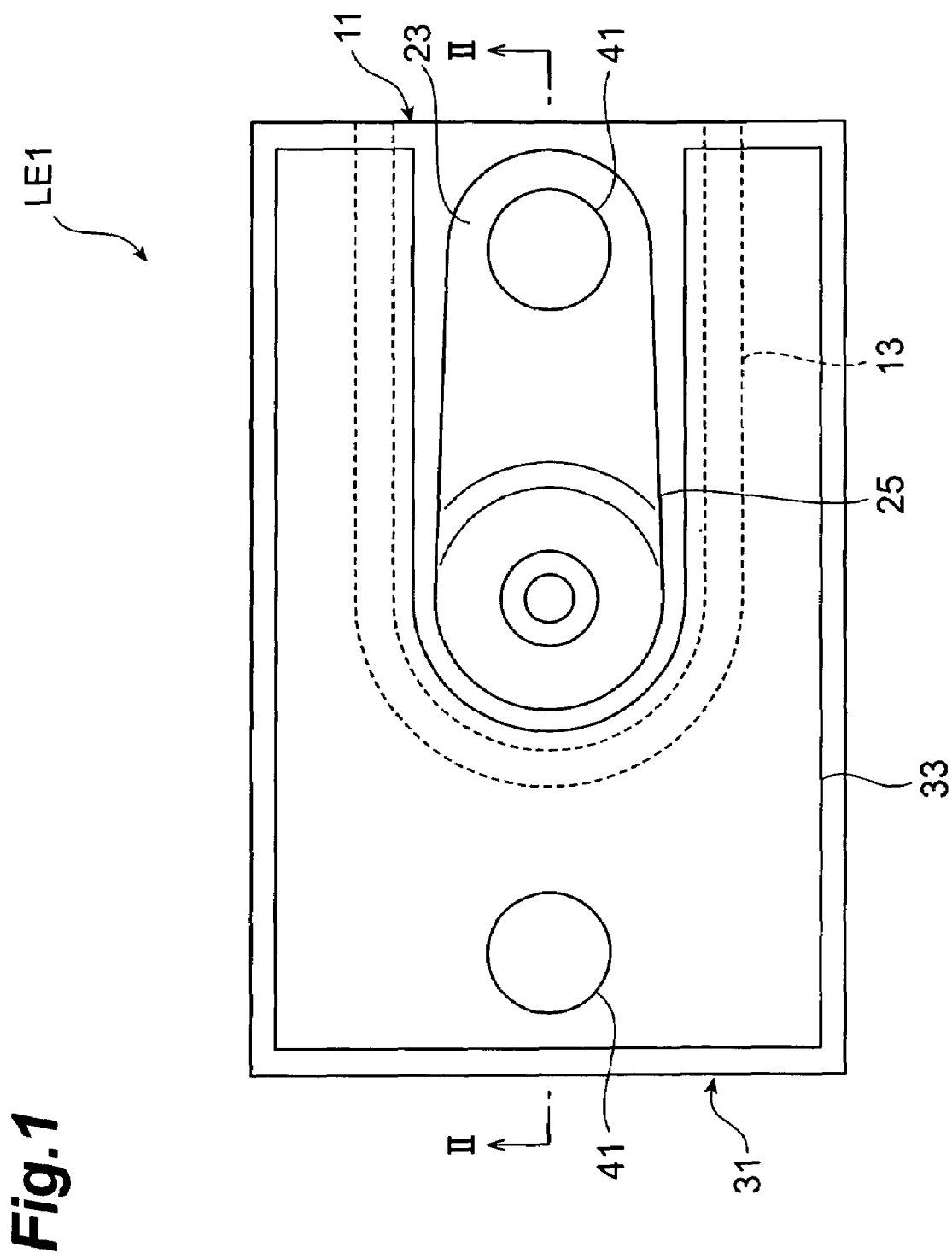
FIG. 1 is a schematic plan view showing a semiconductor light-emitting device in accordance with the first embodiment.
Figure 2:
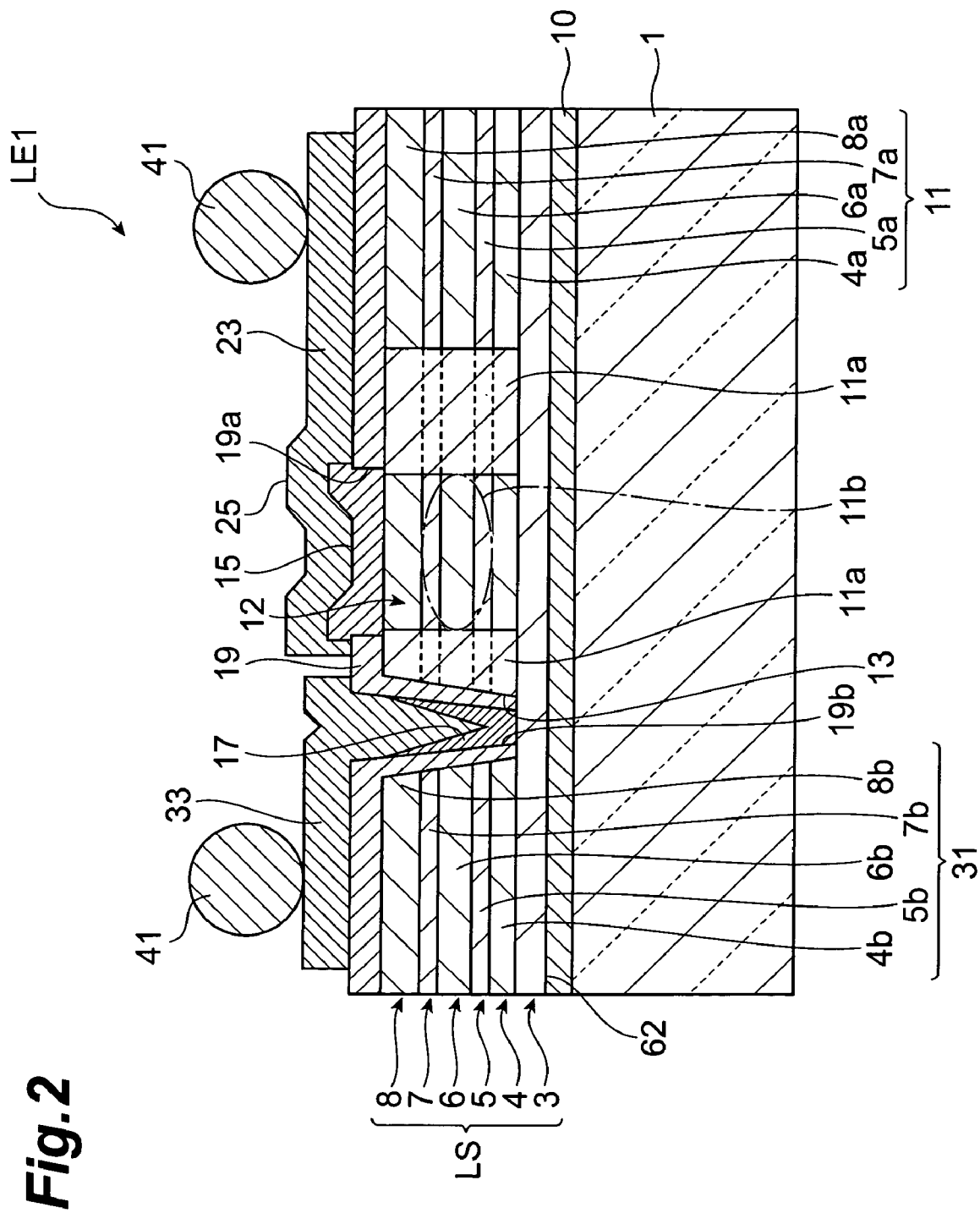
FIG. 2 is a schematic sectional view taken along the line II-II in FIG. 1.

FIG. 1 is a schematic plan view showing a semiconductor light-emitting device in accordance with the first embodiment. FIG. 2 is a schematic sectional view taken along line II-II in FIG. 1.

The semiconductor light-emitting device LE1 has a multilayer structure LS and a glass substrate 1. This semiconductor light-emitting device LE1 is a vertical cavity surface emitting laser (VCSEL) of back emission type which emits light from the side of the glass substrate 1. The semiconductor light-emitting device LE1 is a light-emitting device for short-distance optical communications in the wavelength band of 0.85 μm, for example.

The multilayer structure LS includes a p-type (first conductive type) contact layer 3, a p-type first distributed Bragg reflector (DBR) layer 4, a p-type first cladding layer 5, an active layer 6, an n-type (second conductive type) second cladding layer 7, and an n-type second DBR layer 8. The multilayer structure LS generates light when a voltage is applied thereto, and emits the light from a light exit face 62, which is the lowermost surface. The glass substrate 1 is fixed to the light exit face 62 by way of a film 10. The glass substrate 1 has a thickness of about 0.3 mm and is optically transparent to the light generated by the multilayer structure LS. The film 10 is formed on the side of the first DBR layer 4 (or contact layer 3) of the multilayer structure LS. The film 10 is made of silicon oxide ($SiO_2$) and has a thickness of about 0.1 μm. The contact layer 3 is positioned between the film 10 and the first DBR layer 4.

The multilayer structure LS has a light-emitting part 11 and a pad electrode mounting part 31. The light-emitting part 11 and the pad electrode mounting part 31 are arranged on the contact layer 3, while being separated from each other. An opening 13 is formed between the light-emitting part 11 and pad electrode mounting part 31. The bottom of the opening 13 reaches the contact layer 3.

The light-emitting part 11 includes a p-type first DBR layer 4a, a p-type first cladding layer 5a, an active layer 6a, an n-type second cladding layer 7a, and an n-type second DBR layer 8a, and is separated from the pad electrode mounting part 31 by the opening 13. The light-emitting part 11 is formed with an insulated or semi-insulated current-narrowing region 11a. The current-narrowing region 11a is arranged so as to surround a multilayer region 12 including a part of each of the first cladding layer 5a, active layer 6a, second cladding layer 7a, and second DBR layer 8a. The current-narrowing region 11a extends from the second DBR layer 8a in the light-emitting part 11 to the vicinity of the boundary between the first DBR layer 4a and first cladding layer 5a.

An insulating film 19 is formed on the front face of the light-emitting part 11. The insulating film 19 is made of $SiN_X$ and has a thickness of about 0.2 μm, for example.

In the light-emitting part 11, a vertical resonator is constructed by the first DBR layer 4a and second DBR layer 8a holding the active layer 6a therebetween. In the light-emitting part 11, the current-narrowing region 11a narrows the current supplied to the active layer 6a, thereby limiting a region which emits light. Namely, the above-mentioned multilayer region 12 positioned on the inside of the current-narrowing region 11a in the light-emitting part 11, such as the first cladding layer 5a, active layer 6a, and second cladding layer 7a that are held between the first DBR layer 4a and second DBR layer 8a in particular, functions as a light-emitting region 11b.

An n-side electrode (cathode) 15 is arranged on the front face of the light-emitting part 11. Through a contact hole 19a formed in the insulating film 19, the n-side electrode 15 is electrically connected to a part of the second DBR layer 8a which part is contained in the multilayer region 12. The n-side electrode 15 is made of a multilayer structure of AuGe/Ni/Au and has a thickness of about 1.0 μm.

An n-side pad electrode 23 (first pad electrode) is arranged on the insulating film 19 on the upper side of the light-emitting part 11. The n-side pad electrode 23 is constituted by Ti/Pt/Au and has a thickness of about 2 μm. A bump electrode 41 is provided on the n-side pad electrode 23 as shown in FIG. 2.

A wiring electrode 25 electrically connects the n-side electrode 15 to the n-side pad electrode 23. Consequently, a part of the second DBR layer 8 which part is inside the current-narrowing region 11a is electrically connected to the n-side pad electrode 23 and the bump electrode 41 through the n-side electrode 15 and the wiring electrode 25. Namely, electrode extraction on the cathode side is realized by the n-side electrode 15, n-side pad electrode 23, wiring electrode 25, and bump electrode 41.

Above the light-emitting part 11, the wiring electrode 25 is arranged on the n-side electrode 15 and the insulating film 19. The wiring electrode 25 is made of a multilayer body of Ti/Pt/Au and has a thickness of about 2 μm. The wiring electrode 25 is formed so as to be partly positioned above the multilayer region 12 and the light-emitting region 11b, while this part functions as a light-reflecting film. A light reflecting film may be provided separately from the wiring electrode 25.

The pad electrode mounting part 31 includes a p-type first DBR layer 4b, a p-type first cladding layer 5b, an active layer 6b, an n-type second cladding layer 7b, and an n-type second DBR layer 8b, and is separated from the light-emitting part 11 by the opening 13. As shown in FIG. 1, the pad electrode mounting part 31 is formed so as to surround the light-emitting part 11 when seen in the light-emitting direction. As with the light-emitting part 11, the insulating film 19 is formed on the surface of the pad electrode mounting part 31.

A p-side electrode 17 is disposed in the opening 13. The p-side electrode 17 is electrically connected to the contact layer 3 through a contact hole 19b formed in the insulating film 19. The p-side electrode 17 is made of a multilayer body of Cr/Au and has a thickness of about 1.0 μm.

A p-side pad electrode 33 (second pad electrode) is arranged on the insulating film 19 on the upper side of the pad electrode mounting part 31. The p-side pad electrode 33 (second pad electrode) is made of a multilayer body of Ti/Pt/Au and has a thickness of about 2 μm. The p-side pad electrode 33 is formed so as to connect with the p-side electrode 17. As with the n-side pad electrode 23, the p-side pad electrode 33 is provided with a bump electrode 41. The n-side pad electrode 23 and the p-side pad electrode 33 have substantially the same height from the glass substrate 1.

The p-side electrode 17 is electrically connected to the p-side pad electrode 33. Consequently, the first DBR layer 4a is electrically connected to the p-side pad electrode 33 and the bump electrode 41 through the contact layer 3 and the p-side electrode 17. Namely, electrode extraction on the anode side is realized by the contact layer 3, p-side electrode 17, p-side pad electrode 33, and bump electrode 41.

The contact layer 3 is a compound semiconductor layer, which is made of GaAs having a carrier concentration of about $1\times10^{19}/cm^3$, for example. The thickness of the contact layer 3 is about 0.2 μm. The contact layer 3 also functions as a buffer layer.

The first DBR layer 4 (4a, 4b) is a mirror layer having a structure in which a plurality of compound semiconductor layers having respective compositions different from each other are alternately laminated. In the first embodiment, the first DBR layer 4 (4a, 4b) is constructed by alternately laminating 20 each of AlGaAs (with Al composition of 0.9) layers having a carrier concentration of about $1\times10^{18}/cm^3$ and AlGaAs (with Al composition of 0.2) layers having a carrier concentration of about $1\times10^{18}/cm^3$ on an undoped AlAs layer. The AlAs layer has a thickness of about 0.1 μm. Each of the AlGaAs (with Al composition of 0.9) layers has a thickness of about 0.04 μm, whereas each of the AlGaAs (with Al composition of 0.2) layers has a thickness of about 0.02 μm.

The first cladding layer 5 (5a, 5b) is a compound semiconductor layer, which is made of AlGaAs having a carrier concentration of about $1\times10^{18}/cm^3$, for example. The thickness of the first cladding layer 5 (5a, 5b) is about 0.1 μm.

The active layer 6 (6a, 6b) is a multiple quantum well (MQW) active layer having a structure in which different compound semiconductor layers are alternately laminated. In this embodiment, the active layer 6 (6a, 6b) is constructed by alternately laminating three each of AlGaAs and GaAs layers. Each of the AlGaAs layers has a thickness of about 0.1 μm, whereas each of the GaAs layers has a thickness of about 0.05 μm.

The second cladding layer 7 (7a, 7b) is a compound semiconductor layer, which is made of AlGaAs having a carrier concentration of about $1\times10^{18}/cm^3$, for example. The thickness of the second cladding layer 7 (7a, 7b) is about 0.1 μm.

As with the first DBR layer 4 (4a, 4b), the second DBR layer 8 (8a, 8b) is a mirror layer having a structure in which a plurality of compound semiconductor layers having respective compositions different from each other are alternately laminated. In this embodiment, the second DBR layer 8 (8a, 8b) is constructed by alternately laminating 30 each of AlGaAs (with Al composition of 0.9) layers having a carrier concentration of about $1\times10^{18}/cm^3$ and AlGaAs (with Al composition of 0.2) layers having a carrier concentration of about $1\times10^{18}/cm^3$, and laminating an undoped GaAs layer thereon. Each of the AlGaAs (with Al composition of 0.9) layers has a thickness of about 0.04 μm, whereas each of the AlGaAs (with Al composition of 0.2) layers has a thickness of about 0.02 μm. The GaAs layer functions as a buffer layer, and has a thickness of about 0.1 μm.

When a sufficient voltage is applied between the n-side pad electrode 23 and the p-side pad electrode 33 through the two bump electrodes 41 so that a current flows through the device LE1, the light-emitting region 11b generates light.

A method of manufacturing the semiconductor light-emitting device LE1 will now be explained with reference to FIGS. 3 to 10. FIGS. 3 to 10 are views for explaining the method of manufacturing the semiconductor light-emitting device in accordance with the first embodiment, illustrating a longitudinal cross section of the semiconductor light-emitting device. This manufacturing method sequentially executes the following manufacturing steps (1) to (9):

Step (1)

First, a semiconductor substrate 51 is prepared. For example, the semiconductor substrate 51 has a thickness of 300 to 500 μm and is made of n-type GaAs having a carrier concentration of about $1\times10^{18}/cm^3$. On one principal surface (front face) 74 of the semiconductor substrate 51, an etching stop layer 53, an n-type second DBR layer 8, an n-type second cladding layer 7, an active layer 6, a p-type first cladding layer 5, a p-type first DBR layer 4, and a p-type contact layer 3 are sequentially grown and laminated by metal organic chemical vapor deposition (MOCVD) method, molecular beam epitaxy (MBE) method, or the like (see FIG. 3).

The etching stop layer 53 is made of undoped AlGaAs (with Al composition of 0.5) and has a thickness of about 1.0 μm. The etching stop layer 53 is formed so as to be positioned between the semiconductor substrate 51 and the second DBR layer 8. The Al composition ratio of the etching stop layer 53 is preferably at least 0.4. This is because thus obtained $Al_{0.5}Ga_{0.5}As$ is hard to be etched by an etchant used when etching GaAs which will be explained later.

Step (2)

Figure 3:
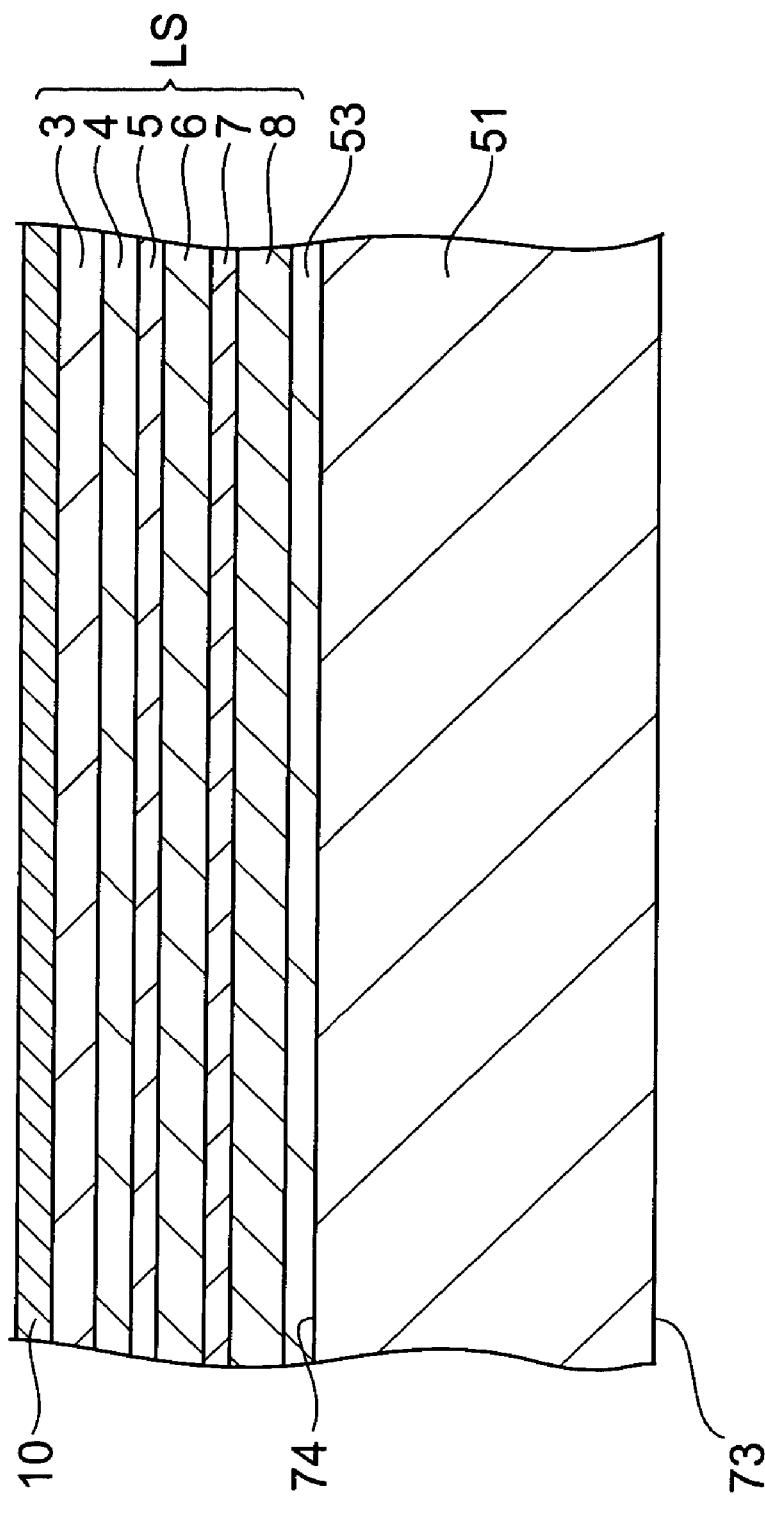
FIG. 3 is a schematic sectional view showing a step of manufacturing the semiconductor light-emitting device in accordance with the first embodiment.

Subsequently, a film 10 is formed on the contact layer 3 by plasma chemical vapor deposition (PCVD) method (see FIG. 3).

The foregoing steps (1) and (2) form the multilayer structure LS, etching stop layer 53, and film 10 on the front face 74 of the semiconductor substrate 51.

Step (3)

Figure 4:
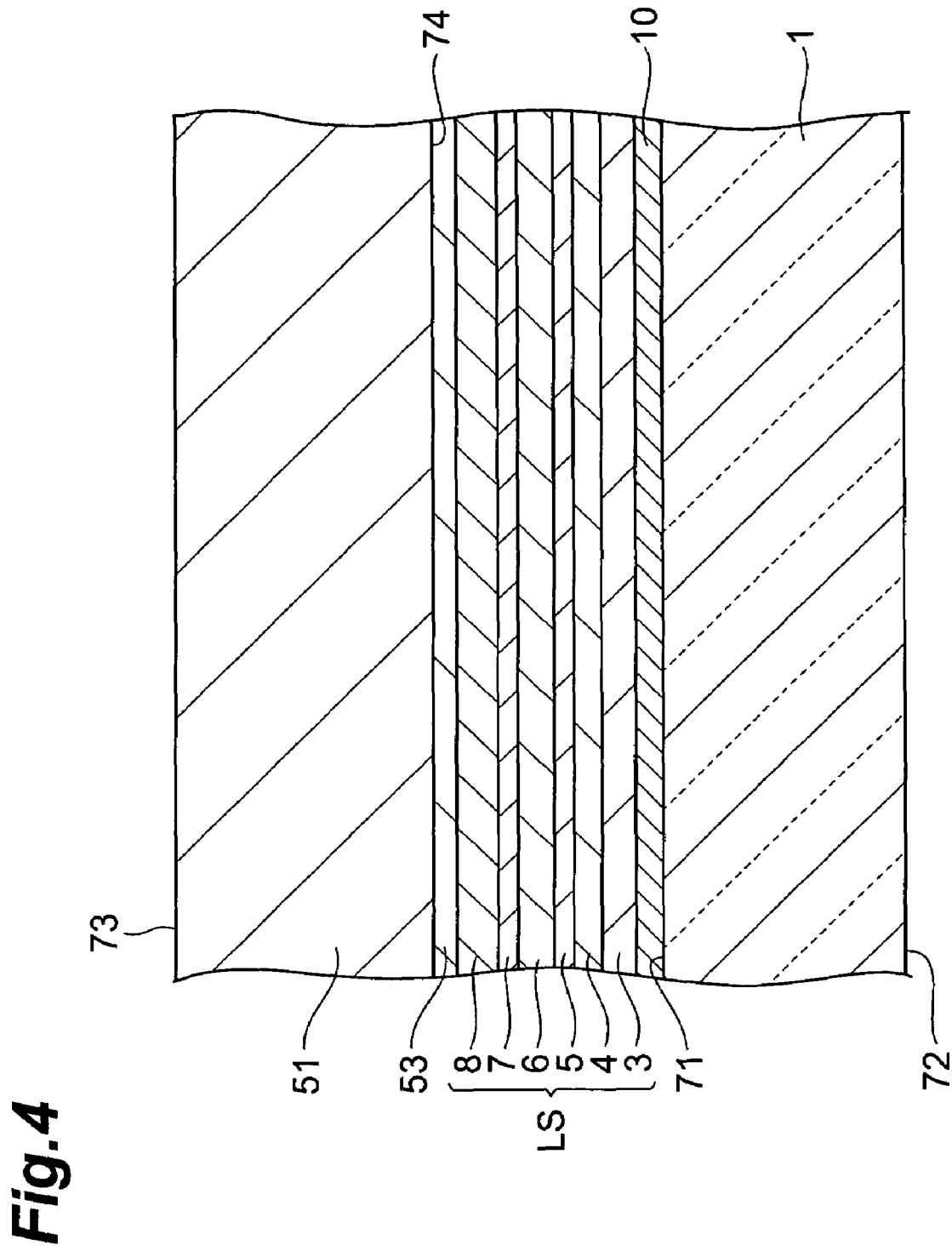
FIG. 4 is a schematic sectional view showing a step of manufacturing the semiconductor light-emitting device in accordance with the first embodiment.
Figure 5:
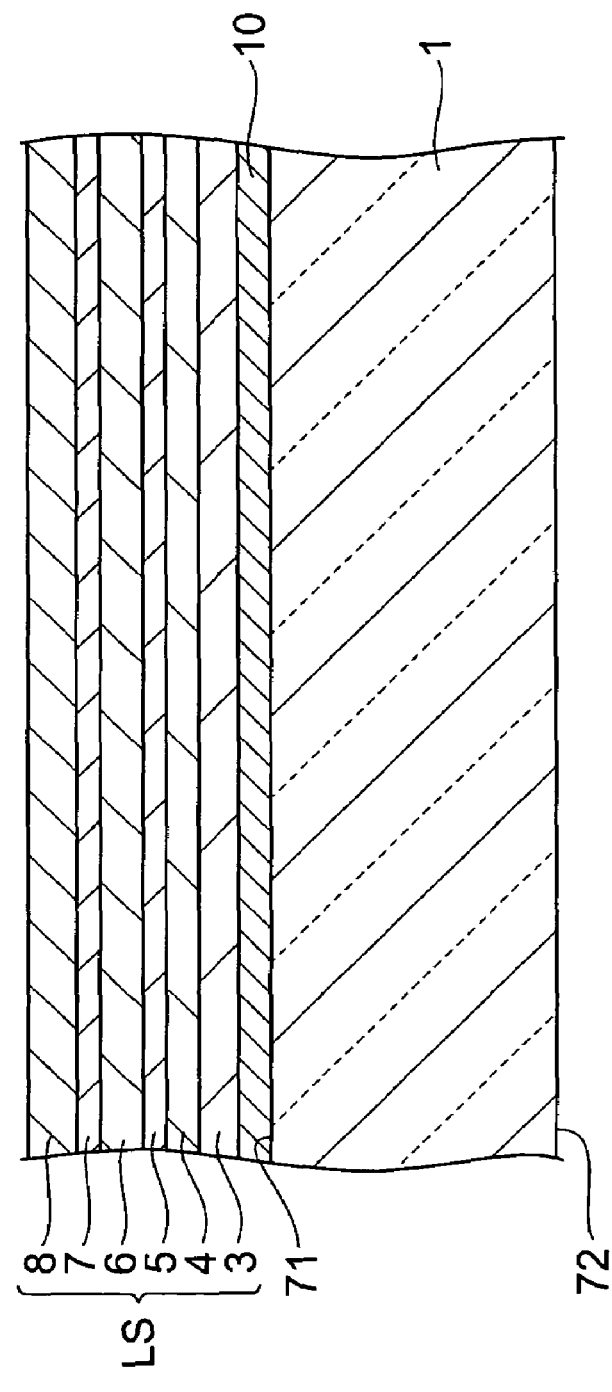
FIG. 5 is a schematic sectional view showing a step of manufacturing the semiconductor light-emitting device in accordance with the first embodiment.
Figure 6:
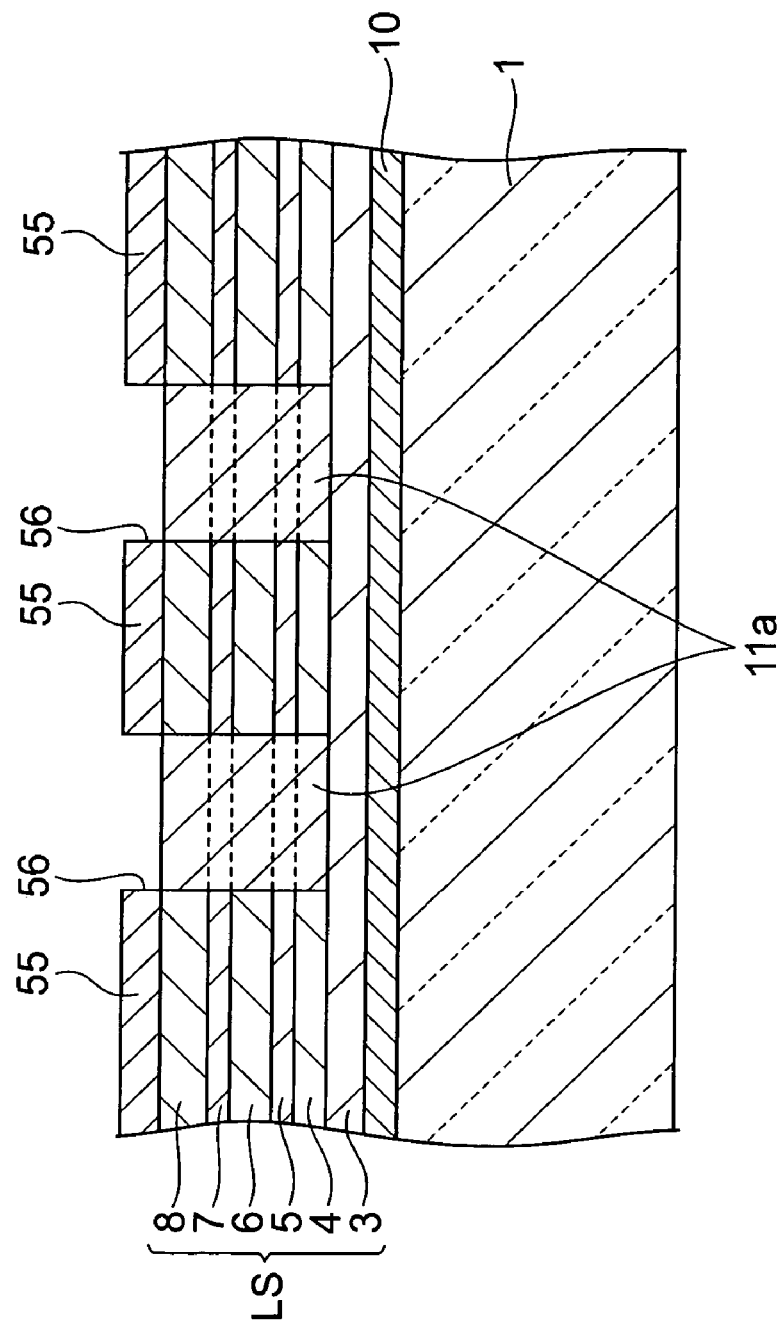
FIG. 6 is a schematic sectional view showing a step of manufacturing the semiconductor light-emitting device in accordance with the first embodiment.
Figure 7:
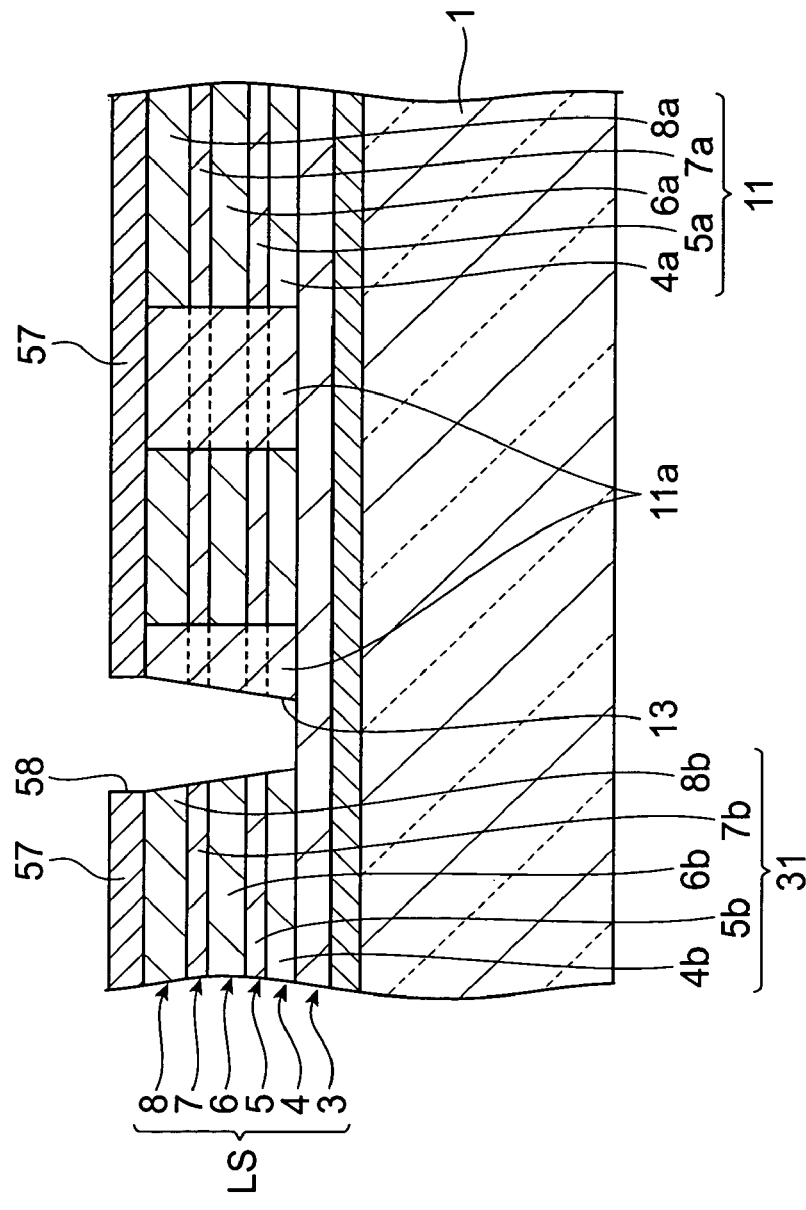
FIG. 7 is a schematic sectional view showing a step of manufacturing the semiconductor light-emitting device in accordance with the first embodiment.
Figure 8:
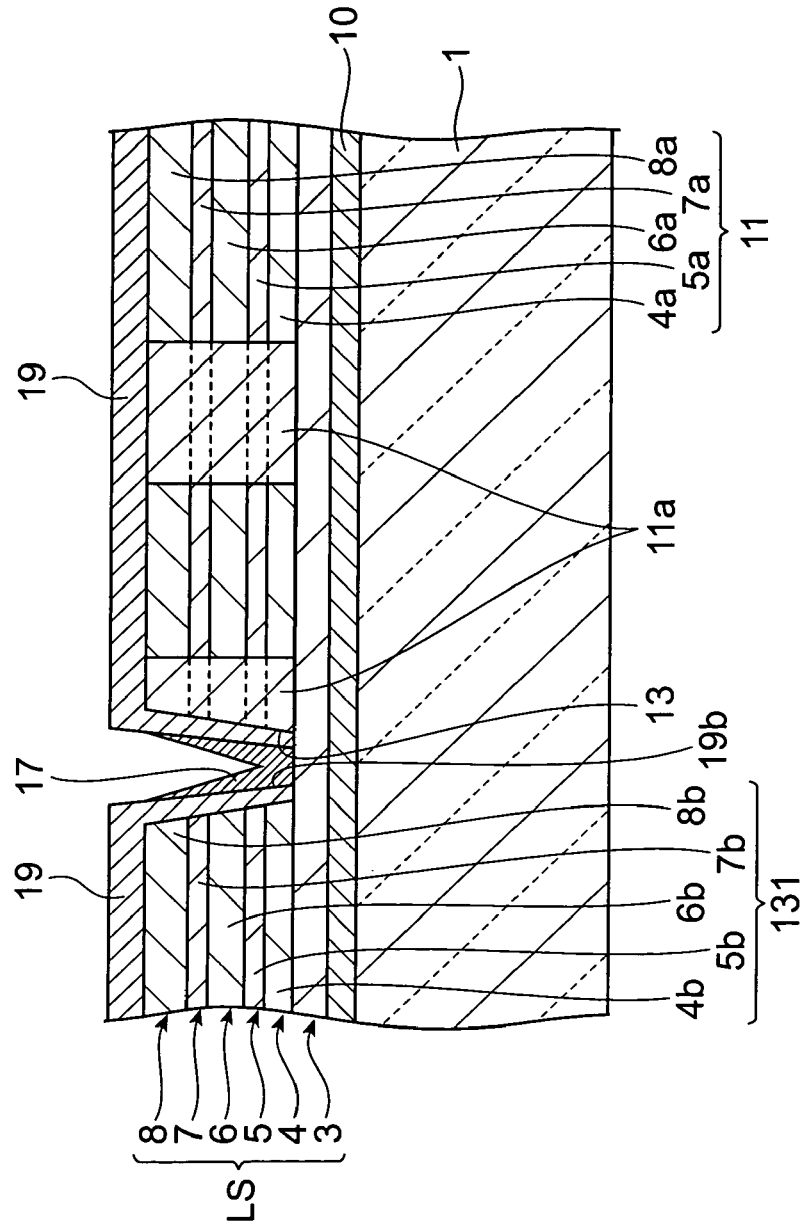
FIG. 8 is a schematic sectional view showing a step of manufacturing the semiconductor light-emitting device in accordance with the first embodiment.

Next, the semiconductor substrate 51 formed with the multilayer structure LS, etching stop layer 53, and film 10 is bonded to a glass substrate 1 (see FIG. 4). First, the glass substrate 1 is prepared, and one principal surface (front face) 71 of the glass substrate 1 is cleaned. Subsequently, the glass substrate 1 and the semiconductor substrate 51 are overlaid on each other so that the cleaned front face 71 of the glass substrate 1 and the topmost film 10 on the semiconductor substrate 51 are in contact with each other. The overlaid glass substrate 1 and semiconductor substrate 51 are pressed and heated, so that the substrates 1 and 51 are fused and bonded to each other.

More specifically, it will be preferred if the pressure applied to the overlaid glass substrate 1 and semiconductor substrate 51 is about 98 kPa, and the heating temperature is 500 to 700° C. Since the topmost film 10 on the semiconductor substrate 51 is made of silicon oxide, pressing and heating under such a condition fuses the topmost film 10 onto the front face 71 of the glass substrate 1, and bonds the multilayer structure LS to the glass substrate 1.

For performing this bonding step, it is desirable that not only the front face 71 of the glass substrate 1 but also the topmost film 10 on the semiconductor substrate 51 be clean. For this purpose, it will be preferred if a fusing operation is performed immediately after the semiconductor substrate 51 is taken out of the PCVD apparatus having formed the topmost film 10, for example.

Preferably, the glass substrate in use has a coefficient of thermal expansion closer to that of GaAs. This can minimize the stress occurring between the semiconductor substrate 51 and glass substrate 1 in a cooling step after the heating because of the difference between their coefficients of thermal expansion, and therefore minimize the decrease in bonding strength and occurrence of crystal defects caused by the stress.

Step (4)

Next, the semiconductor substrate 51 is removed. After the glass substrate 1 and the semiconductor substrate 51 are bonded together, the other principal surface (rear face) 73 of the semiconductor substrate 51 is exposed at the opposite side of the glass substrate 1. In this step, etching is performed from the side of the rear face 73 of the semiconductor substrate 51, so as to remove the semiconductor substrate 51 and the etching stop layer 53 (see FIG. 5).

More specifically, an etchant exhibiting a low etching rate to the etching stop layer 53 is used first to remove the semiconductor substrate 51. Subsequently, an etchant exhibiting a low etching rate to the GaAs layer in the second DBR layer 8 is used to remove the semiconductor substrate 51. This yields the glass substrate 1 having the multilayer structure LS mounted on the front face 71.

The etchants for use are preferably a mixed solvent, ($NH_4OH$ water: $H_2O_2$ water=1:5) of ammonia water ($NH_4OH$) and hydrogen peroxide water ($H_2O_2$), and hydrochloric acid (HCl). First, the bonded glass substrate 1 and semiconductor substrate 51 are dipped into the mixed solution of $NH_4OH$ water and $H_2O_2$ water. This etches the semiconductor substrate 51 from the rear face side. When the etching advances to such an extent that the semiconductor substrate 51 is removed, the etching stop layer 53 is exposed in the etchant. The etching stop layer 53 ($Al_{0.5}Ga_{0.5}As$) is highly resistant to this etchant, so that the etching rate becomes very low. Consequently, the etching automatically stops when the etching stop layer 53 is exposed. Thus, the semiconductor substrate 51 is initially removed.

Subsequently, the glass substrate 1 on which the etching stop layer 53, multilayer structure LS, and the like remain is taken out from the mixed solution of $NH_4OH$ water and $H_2O_2$ water, washed with water, dried, and then dipped in a hydrochloric acid (HCl) solution. For attaining a higher etching rate, it will be preferred if the HCl solution is preheated to about 50° C. Since GaAs is hardly etched by HCl, the etching stop layer 53 is etched alone this time, so that etching automatically stops when the GaAs layer of the second DBR layer 8 is exposed. The etching stop layer 53 is removed in this way. The semiconductor substrate 51 and the etching stop layer 53 may be removed by chemical mechanical polishing (CMP) instead of etching.

Step (5)

Next, a resist film 55 is formed on the second DBR layer 8. The resist film 55 is patterned so as to have an opening 56 at a position corresponding to a current-narrowing region 11a. Thereafter, using the patterned resist film 55 as a mask, an ion implanter implants the multilayer structure LS with protons (H$^+$). The protons are implanted to the vicinity of the boundary between the first DBR layer 4 and the first cladding layer 5. The region implanted with the protons becomes semi-insulated, whereby the current-narrowing region 11a is formed (see FIG. 6). Oxygen ions (O$^{2-}$) or iron ions (Fe$^{3+}$) may also be used instead of protons. Then, the resist film 55 is removed.

Step (6)

Next, a resist film 57 is formed on the second DBR layer 8. The resist film 57 is patterned so as to have an opening 58 at a position where an opening 13 is to be formed. Thereafter, using the patterned resist film 57 as a mask, the multilayer structure LS is etched (by wet etching in this embodiment) until the contact layer 3 is exposed. This forms the opening 13, thereby electrically separating the light-emitting part 11 from the pad electrode mounting part 31 (see FIG. 7). Namely, the light-emitting part 11 includes the first DBR layer 4a, first cladding layer 5a, active layer 6a, second cladding layer 7a, and second DBR layer 8a, whereas the pad electrode mounting part 31 includes the first DBR layer 4b, first cladding layer 5b, active layer 6b, second cladding layer 7b, and second DBR layer 8b. The etchants for use are preferably hydrogen peroxide water and hydrochloric acid (HCl). Then, the resist film 57 is removed.

Step (7)

Next, an insulating film 19 made of SiN$_x$ is formed on the front face of the second DBR layer 8 by PCVD method. Then, a resist film (not depicted) having an opening at a position corresponding to a p-side electrode 17 is formed on the insulating film 19. Using this resist film as a mask, a part of the insulating film 19 is removed with buffered hydrofluoric acid (BHF), so as to form a contact hole 19b (see FIG. 8). Then, the resist film is removed.

Thereafter, a resist film (not depicted) having an opening at a position corresponding to the opening 13 is formed on the insulating film 19 again. Then, vapor deposition using this resist film as a mask and liftoff method form the p-side electrode 17 made of Cr/Au on the contact layer 3 that is exposed by forming the opening 13 (see FIG. 8). Then, the resist film is removed.

Step (8)

Next, a resist film (not depicted) having an opening at a position corresponding to an n-side electrode 15 is formed. Then, using this resist film as a mask, the insulating film 19 is removed by BHF, so as to form a contact hole 19a in the insulating film 19 (see FIG. 9). Then, the resist film is removed.

Figure 9:
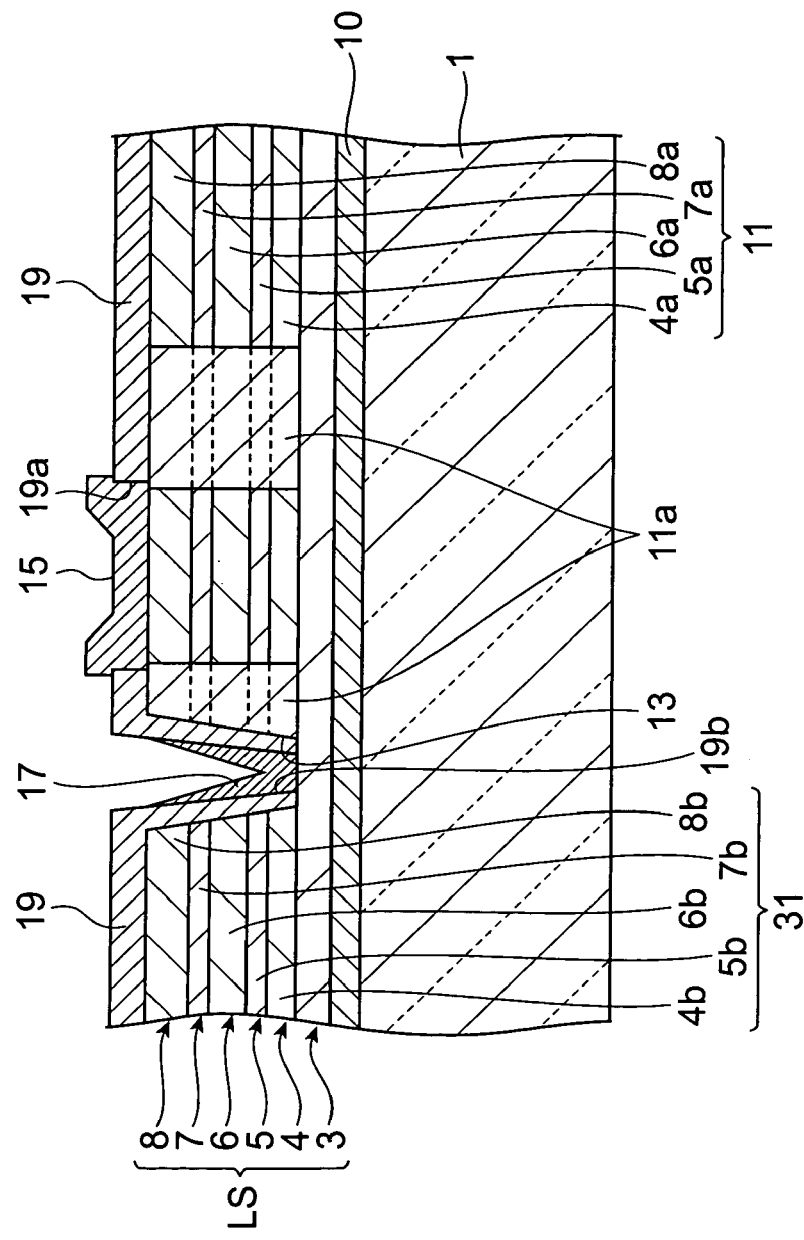
FIG. 9 is a schematic sectional view showing a step of manufacturing the semiconductor light-emitting device in accordance with the first embodiment.
Figure 10:
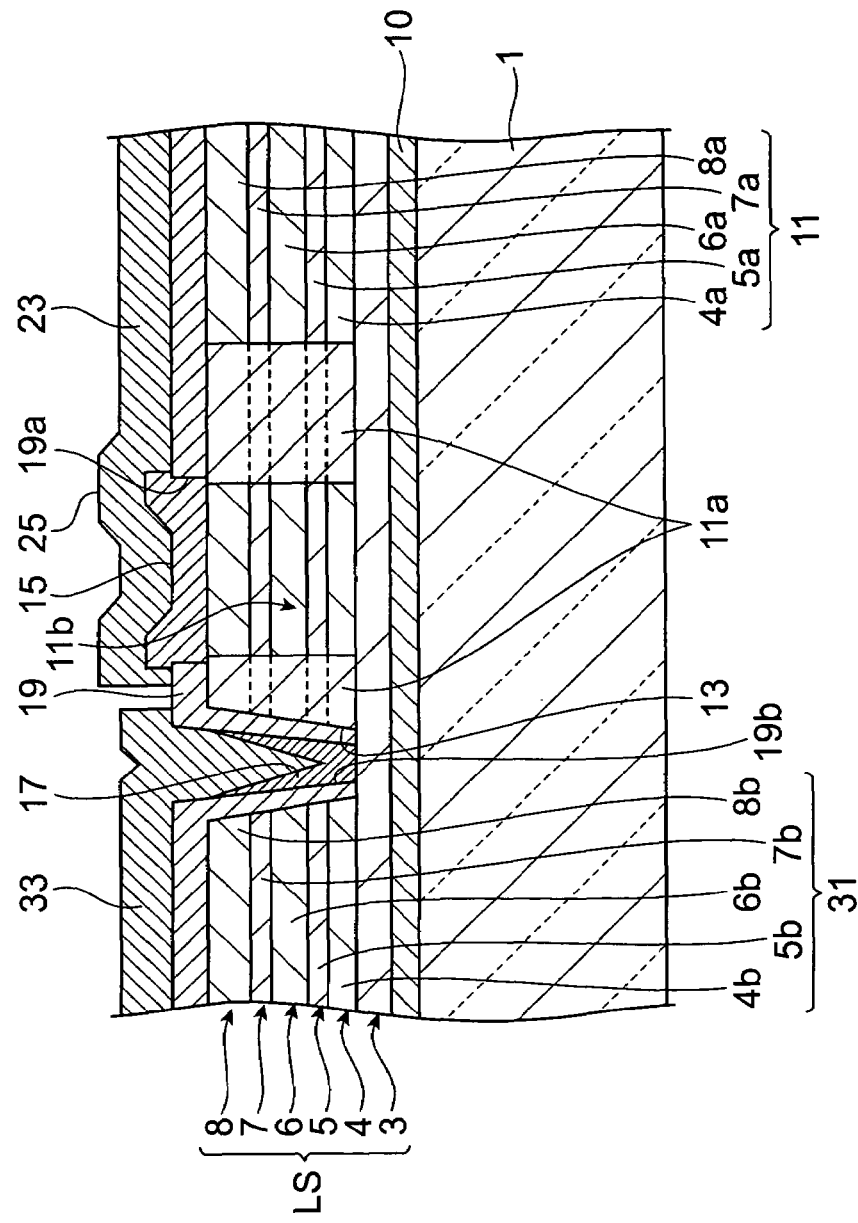
FIG. 10 is a schematic sectional view showing a step of manufacturing the semiconductor light-emitting device in accordance with the first embodiment.

Thereafter, a resist film is formed again so as to have an opening at a position where the n-side electrode 15 is to be formed, and the n-side electrode 15 made of AuGe/Ni/Au is formed on the second DBR layer 8a by vapor deposition and liftoff method while using this resist film as a mask (see FIG. 9). Then, the resist film is removed.

Step (9)

Next, a resist film (not depicted) having an opening at positions corresponding to an n-side pad electrode 23, a wiring electrode 25, and a p-side pad electrode 33 is formed. Then, using this resist film as a mask, the n-side pad electrode 23, wiring electrode 25, and p-side pad electrode 33 made of Ti/Pt/Au are formed (see FIG. 10). Here, the wiring electrode 25 is formed so as to cover the light-emitting region 11b. The n-side pad electrode 23 and the wiring electrode 25 would be formed integrally. Then, the resist film is removed. Thereafter, sintering is performed in an H$_2$ atmosphere. Though the n-side pad electrode 23 and the wiring electrode 25 are formed integrally, they are not restricted thereto but may be formed separately from each other.

These steps (1) to (9) complete the semiconductor light-emitting device LE1 having the structure shown in FIGS. 1 and 2.

The bump electrodes 41 can also be obtained by forming solders on the n-side pad electrode 23 and the p-side pad electrode 33 by plating method, solder ball mounting method, or printing method, and then causing the solders to reflow. The bump electrodes 41 are not limited to solder, but may be gold bumps, nickel bumps, and copper bumps as well as conductive resin bumps containing metals such as conductive fillers.

As in the foregoing, even when the contact layer 3, first DBR layer 4, first cladding layer 5, active layer 6, second cladding layer 7, and second DBR layer 8 are formed into thin films, the mechanical strength of the multilayer structure LS (laminated contact layer 3, first DBR layer 4, first cladding layer 5, active layer 6, second cladding layer 7, and second DBR layer 8) is secured by the glass substrate 1 in this embodiment. Also, unlike conventional semiconductor light-emitting devices, it is unnecessary to form the part maintaining the thickness of the substrate, so that the semiconductor light-emitting device LE1 can easily be made small.

Since the multilayer structure LS is fixed to the glass substrate 1 by way of the film 10, the glass substrate 1 can be bonded to the multilayer structure LS without using other adhesives in this embodiment. As with the glass substrate 1, silicon oxide which constitutes the film 10 is optically transparent to the light generated by the multilayer structure LS. Therefore, the light emitted from the multilayer structure LS can reach the glass substrate 1 without being absorbed by adhesives.

The multilayer structure LS includes the light-emitting part 11 and pad electrode mounting part 31, whereas the n-side pad electrode 23 electrically connected to the multilayer region 12 inside the current-narrowing region 11a is arranged on the light-emitting part 11, whereas the p-side pad electrode electrically connected to the contact layer 3 is arranged on the pad electrode mounting part 31. Consequently, the n-side pad electrode 23 and the p-side pad electrode 33 are arranged on the opposite side of the light exit face, which makes it easier to implement the semiconductor light-emitting device LE1.

The p-side pad electrode 33 is electrically connected to the contact layer 3 through the opening 13 formed between the light-emitting part 11 and the pad electrode mounting part 31. Consequently, electrodes can be extracted on the side of the first cladding layer 5 more easily and more reliably.

Since the wiring electrode 25 (light-reflecting film) is formed so as to cover the light-emitting region 11b, the light reflected by the wiring electrode 25 is also emitted from the glass substrate 1. This can improve the optical output.

The method in accordance with this embodiment bonds the glass substrate 1 to the semiconductor substrate 51 that mounts the multilayer structure LS so that the film 10 made of silicon oxide formed on the front face of the multilayer structure LS contacts one of the principal surfaces of the glass substrate 1, and then removes the semiconductor substrate 51. This can easily manufacture the semiconductor light-emitting device LE1 in which the glass substrate 1 is fixed to the multilayer structure LS by way of the film 10.

Since the glass substrate 1 remains after the semiconductor substrate 51 is removed, the mechanical strength of the multilayer structure LS is held by the glass substrate 1 in the subsequent manufacturing steps. Before the bonding of the glass substrate 1, the mechanical strength of the multilayer structure LS is held by the semiconductor substrate 51.

The manufacturing method in accordance with this embodiment comprises the step of forming the etching stop layer 53 between the semiconductor substrate 51 and the multilayer structure LS before forming the multilayer structure LS (laminated contact layer 3, first DBR layer 4, first cladding layer 5, active layer 6, second cladding layer 7, and second DBR layer 8); and the step of removing the etching stop layer 53 by wet etching after removing the semiconductor substrate 51. Therefore, selectively using an etchant which can etch the semiconductor substrate 51 but not the etching stop layer 53 and an etchant which can etch the etching stop layer 53 but not the multilayer structure LS as appropriate can remove the semiconductor substrate 51 and then the etching stop layer 53 alone. Consequently, the semiconductor substrate 51 can be removed reliably and easily while leaving the multilayer structure LS.

Second Embodiment

Figure 11:
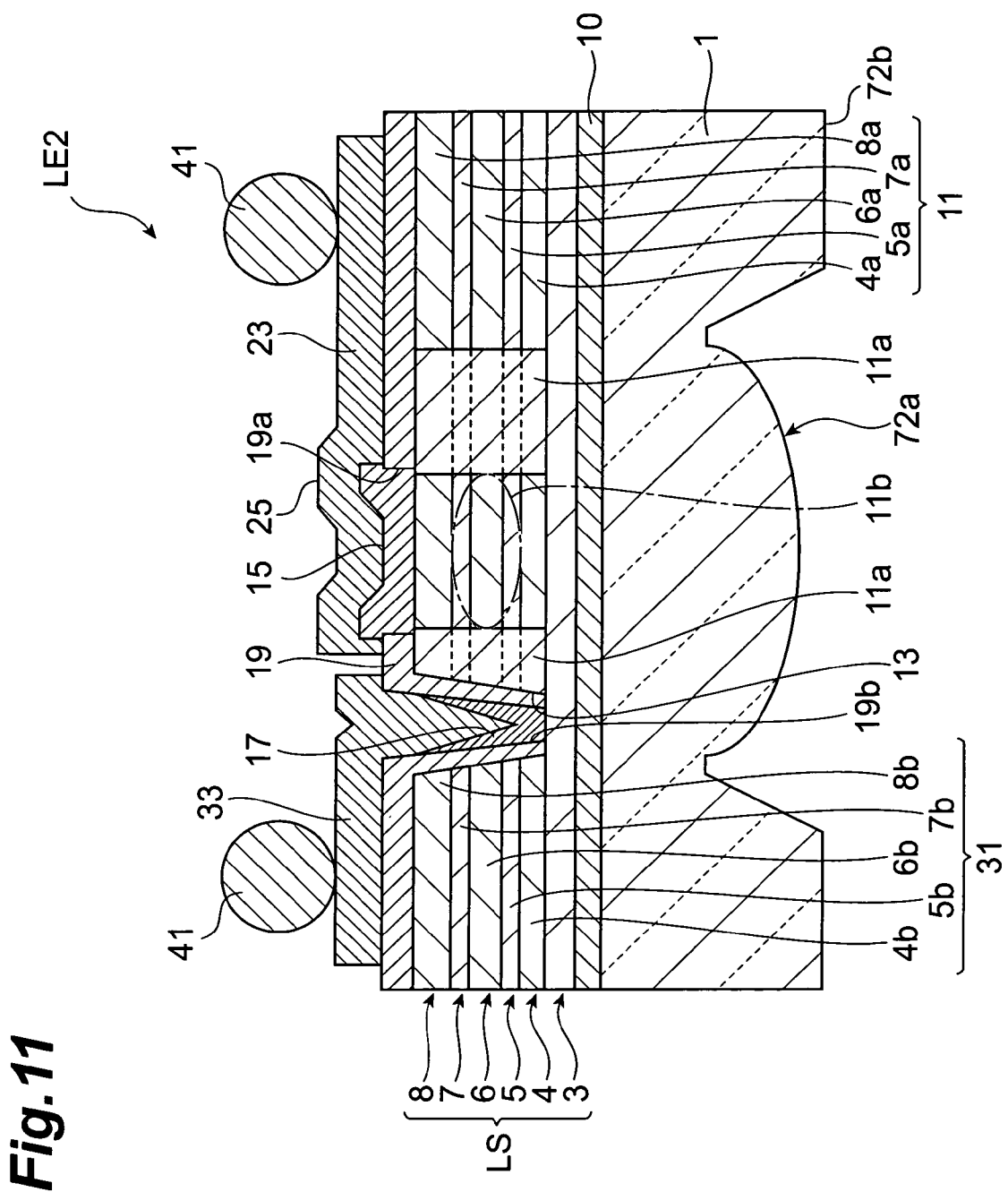
FIG. 11 is a schematic sectional view showing the semiconductor light-emitting device in accordance with the second embodiment.

FIG. 11 is a schematic sectional view showing the structure of a semiconductor light-emitting device in accordance with the second embodiment. The semiconductor light-emitting device LE2 differs from the semiconductor light-emitting device LE1 of the first embodiment in that the glass substrate 1 is formed with a lens part 72a.

The semiconductor light-emitting device LE2 comprises a multilayer structure LS and a glass substrate 1. The semiconductor LE1 is a VCSEL of back emission type which emits light from the side of the glass substrate 1. The semiconductor light-emitting device LE1 is a light-emitting device for short-distance optical communications in the wavelength band of 0.85 μm, for example.

The rear face 72 of the glass substrate 1 is formed with the lens part 72a for receiving the light emitted from the multilayer structure LS. The other part 72b in the rear face 72 is raised from the lens part 72a. Namely, the lens part 72a is depressed from the most raised portion 72b in the rear face 72.

Figure 12:
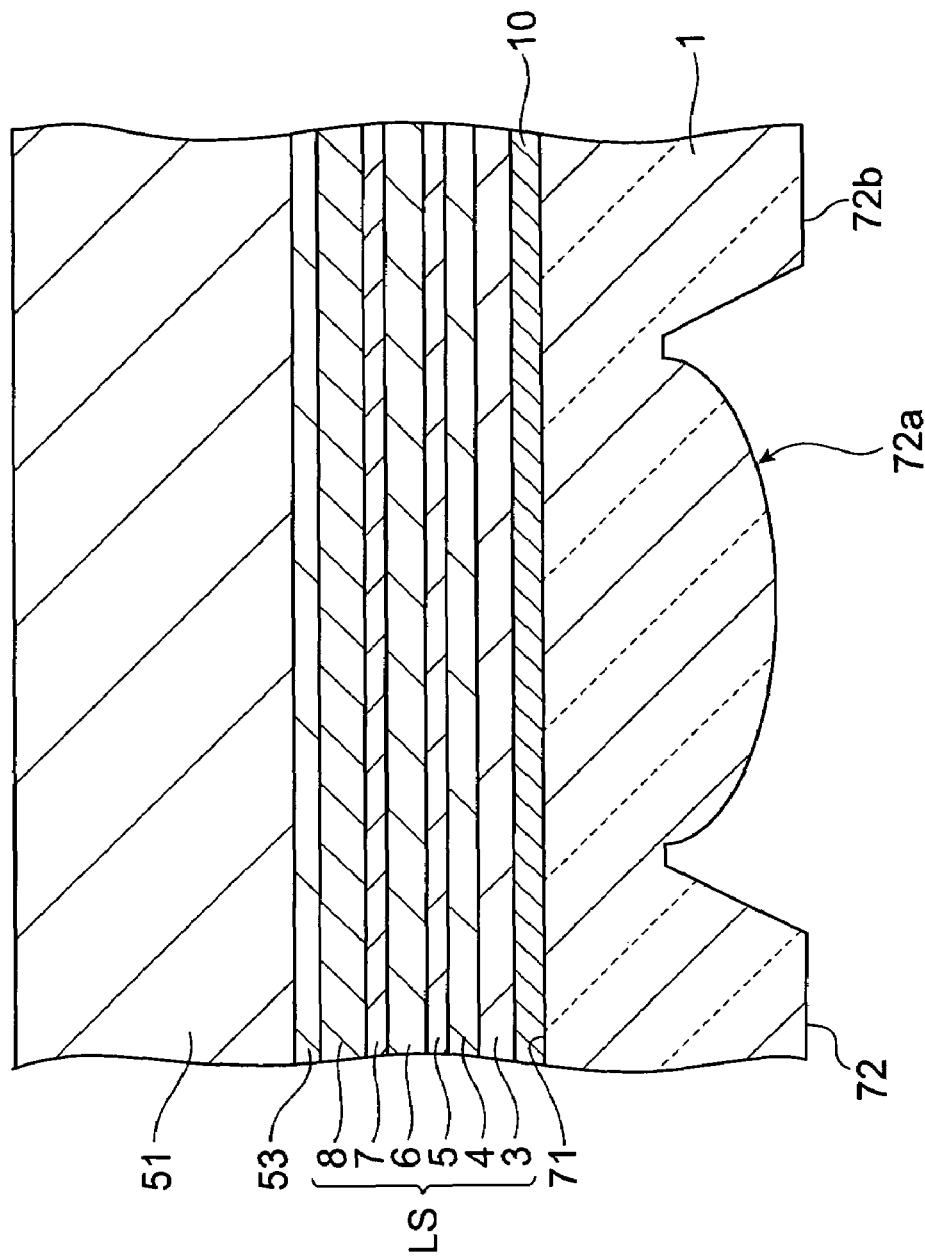
FIG. 12 is a schematic sectional view showing a step of manufacturing the semiconductor light-emitting device in accordance with the second embodiment.
Figure 13:
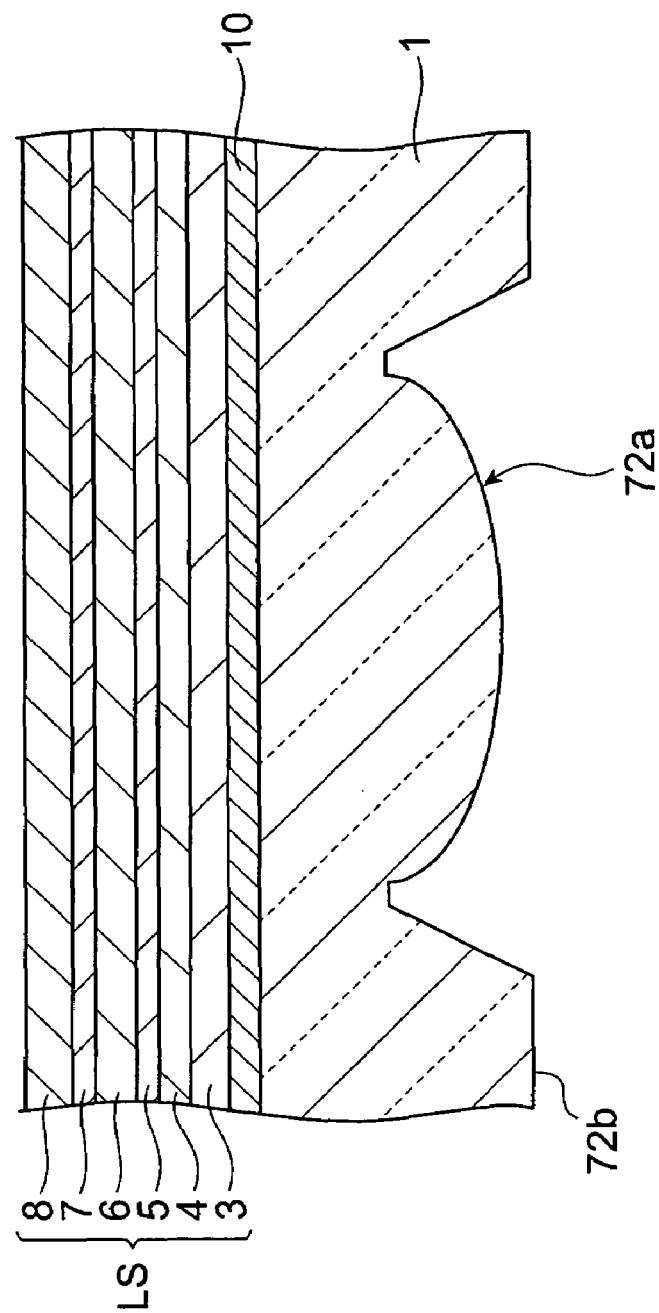
FIG. 13 is a schematic sectional view showing a step of manufacturing the semiconductor light-emitting device in accordance with the second embodiment.
Figure 14:
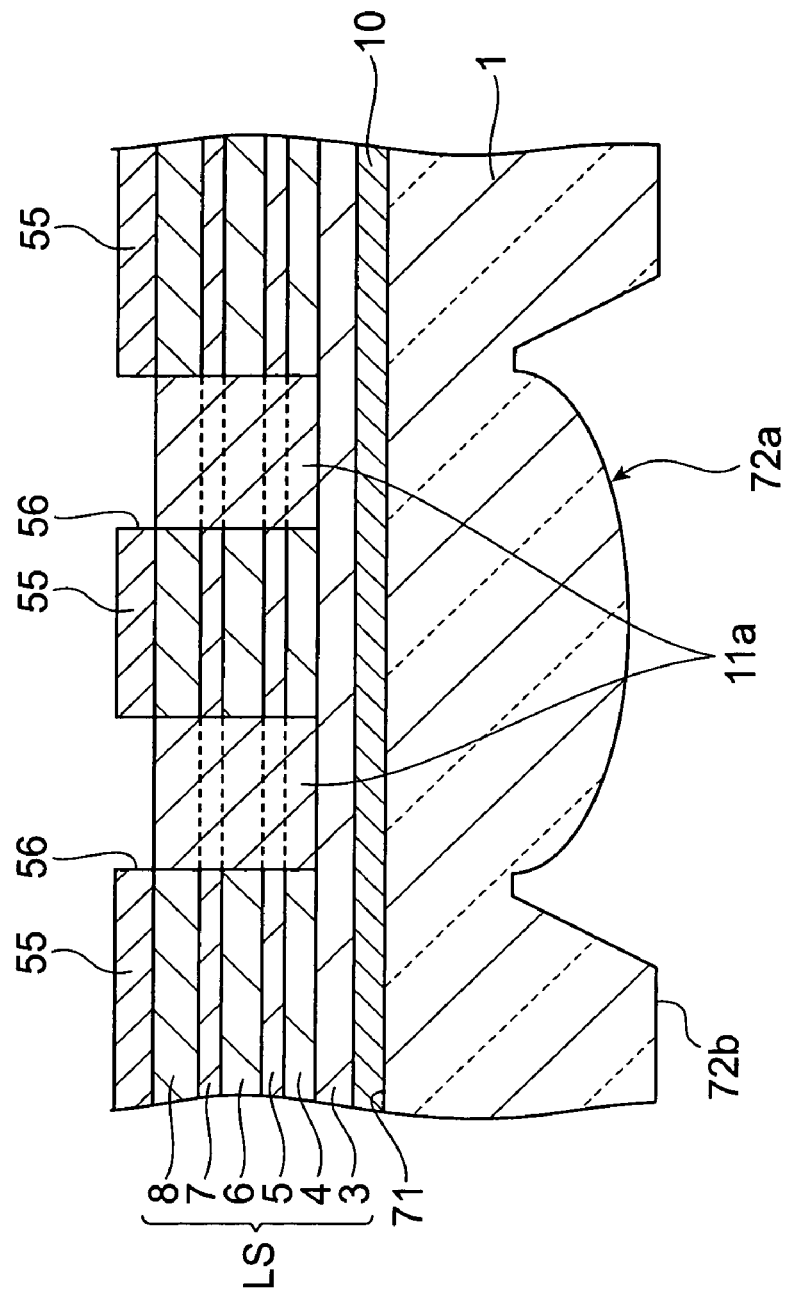
FIG. 14 is a schematic sectional view showing a step of manufacturing the semiconductor light-emitting device in accordance with the second embodiment.
Figure 15:
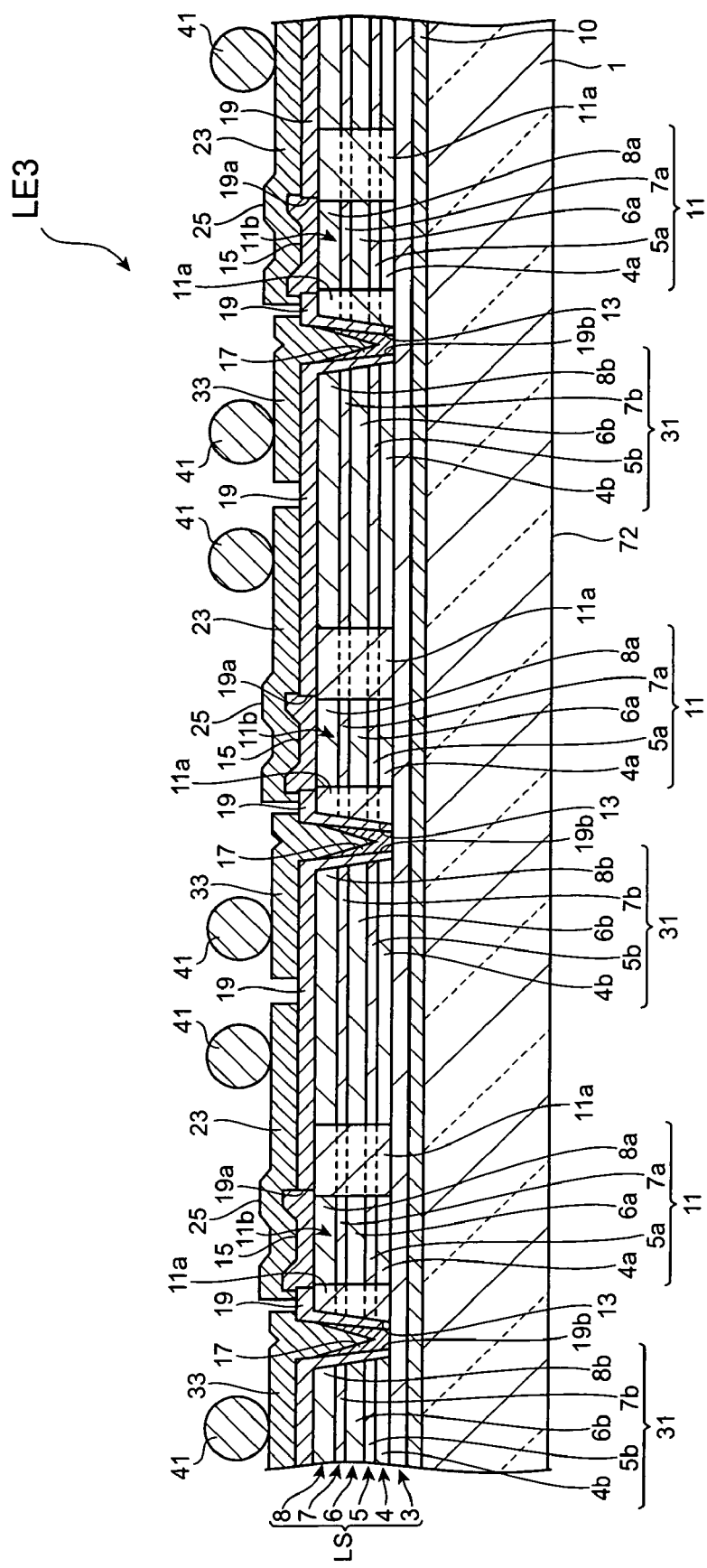
FIG. 15 is a schematic sectional view showing a semiconductor light-emitting device array in accordance with an embodiment of the present invention.
Figure 16:
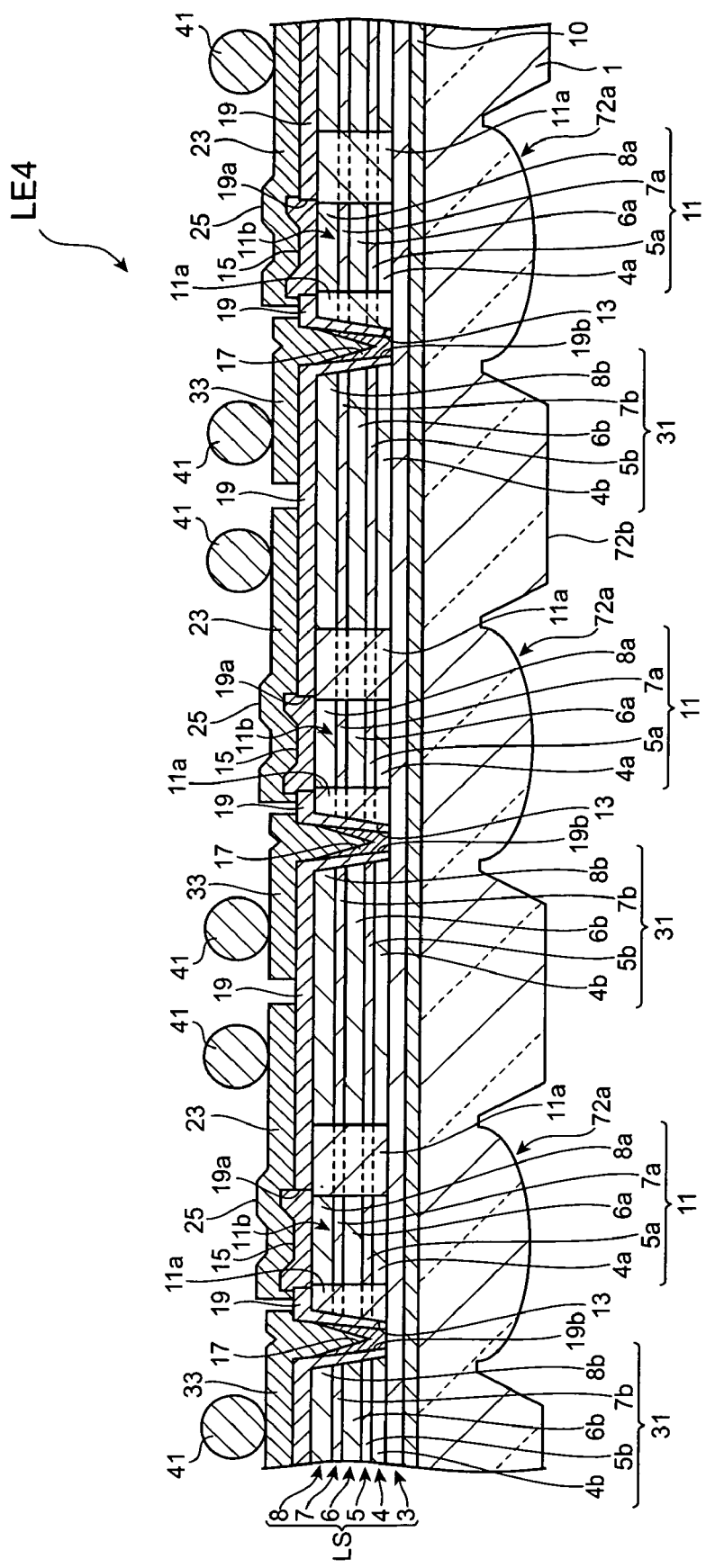
FIG. 16 is a schematic sectional view showing a semiconductor light-emitting device array in accordance with an embodiment of the present invention.
Figure 17:
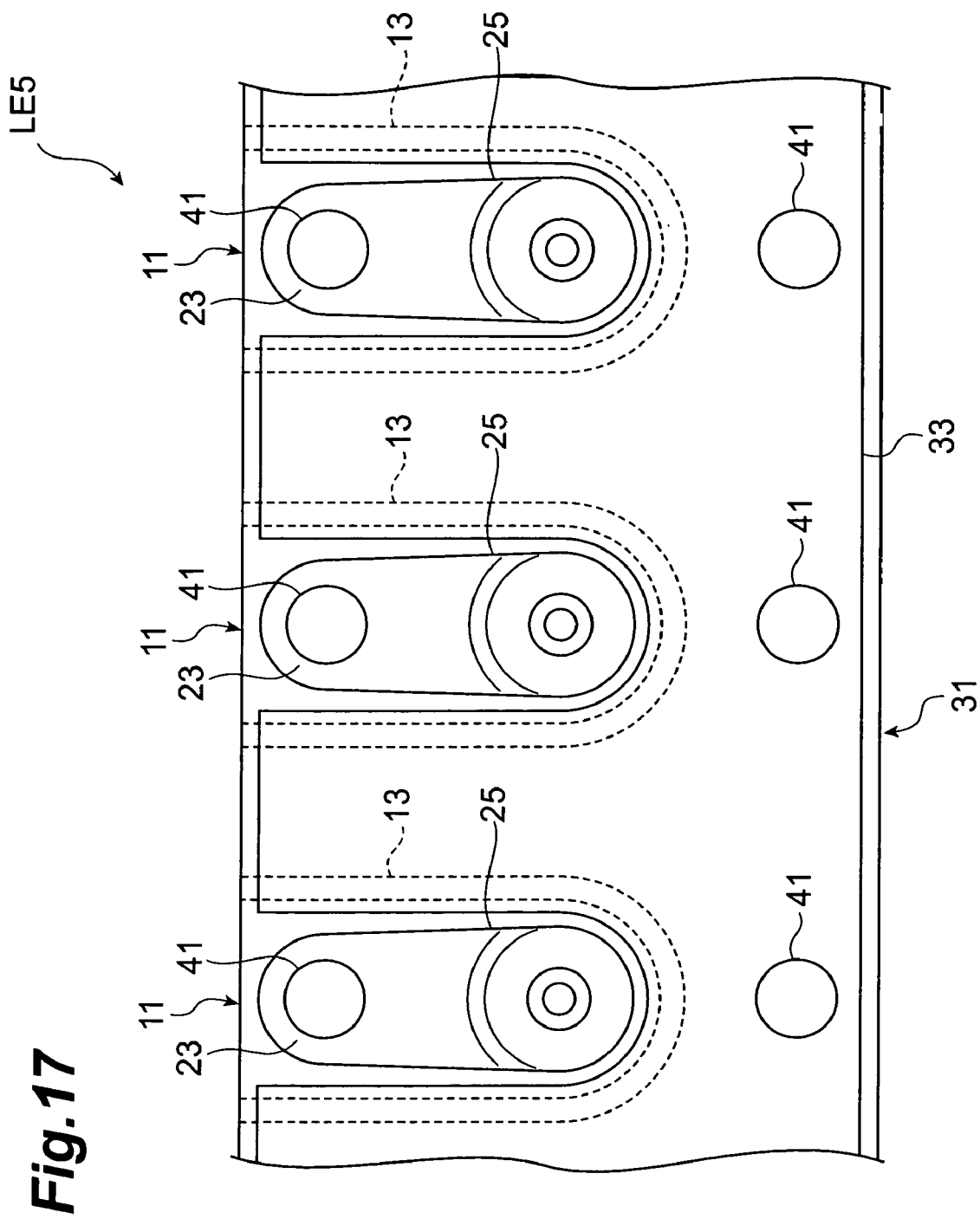
FIG. 17 is a schematic plan view showing a semiconductor light-emitting device array in accordance with an embodiment of the present invention.
Figure 18:
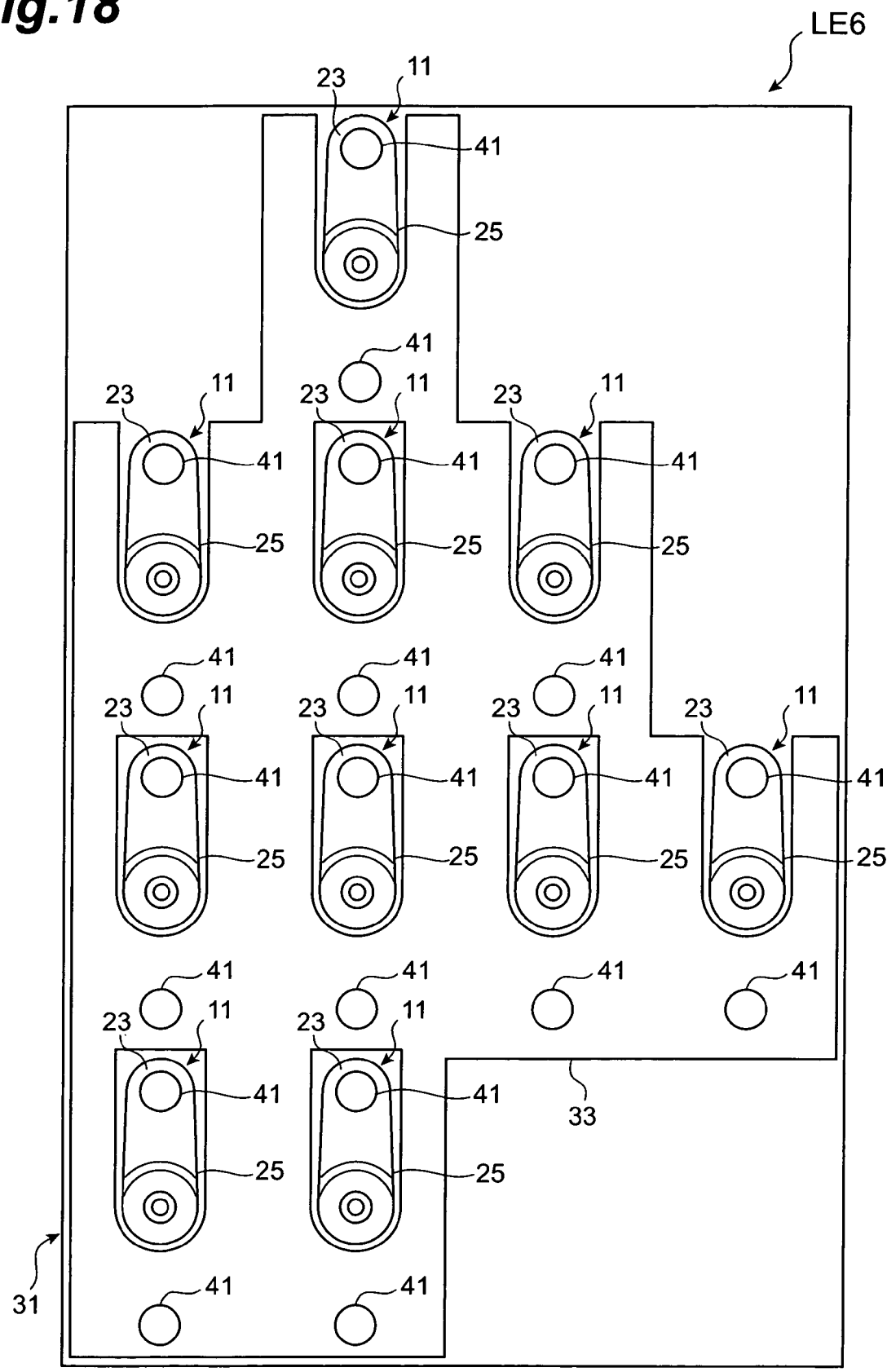
FIG. 18 is a schematic plan view showing a semiconductor light-emitting device array in accordance with an embodiment of the present invention.

With reference to FIGS. 12 to 14, a method of manufacturing the semiconductor light-emitting device LE2 will now be explained. FIGS. 12 to 14 are views for explaining this manufacturing method, and illustrate a cross section of the semiconductor light-emitting device.

This manufacturing method sequentially executes the following steps (1) to (9). Steps (1) and (2) are the same as those in the first embodiment, and thus will not be explained.

Step (3)

Next, the glass substrate 1 is bonded to the semiconductor substrate 51 formed with the multilayer structure LS, etching stop layer 53, and film 10 (see FIG. 12). The bonding method is the same as that in step (3) in the first embodiment. More specifically, the glass substrate 1 having the rear face 72 formed with the lens part 72a is prepared, and the front face 71 of the glass substrate 1 is cleaned. Subsequently, the glass substrate 1 and the semiconductor substrate 51 are overlaid on each other so that the cleaned front face 71 of the glass substrate 1 and the topmost film 10 on the semiconductor substrate 51 come into contact with each other. The overlaid glass substrate 1 and semiconductor substrate 51 are pressed and heated, so as to be fused and bonded to each other. The specific bonding method is the same as that in step (3) in the first embodiment.

Step (4)

Then, the semiconductor substrate 51 and the etching stop layer 53 are removed (see FIG. 13). The removing method is the same as that in step (4) in the first embodiment.

Next, a resist film 55 is formed on the second DBR layer 8, and is patterned, so as to provide an opening 56 at a position where the current-narrowing region 11a is to be formed (see FIG. 14). Providing the front face 71 of the glass substrate 1 with a marker and using a double-sided aligner can easily align the lens part 72a with the position to form the current-narrowing region 11a with reference to the provided marker. The outer shape of the lens part 72a may be utilized as a marker instead of providing the marker.

Thereafter, using the patterned resist film 55 as a mask, an ion implanter implants the multilayer structure LS with protons ($H^+$). The protons are implanted to the vicinity of the boundary between the first DBR layer 4 and the first cladding layer 5, whereby the region implanted with the protons becomes semi-insulated. This forms the current-narrowing region 11a (see FIG. 14). Then, the resist film 55 is removed.

Steps (6) to (9) are the same as those in the first embodiment, and thus will not be explained here. These steps (1) to (9) complete the semiconductor light-emitting device LE2 having the structure shown in FIG. 11.

As in the foregoing, the mechanical strength of the multilayer structure LS (laminated contact layer 3, first DBR layer 4, first cladding layer 5, active layer 6, second cladding layer 7, and second DBR layer 8) is secured by the glass substrate 1, and the semiconductor light-emitting device LE2 can easily be made small in this embodiment as in the first embodiment.

Further, the glass substrate 1 is provided with the lens part 72a in this embodiment. This can improve the directivity of the emitted light or form parallel light.

The lens part 72a is formed so as to be depressed from the most raised portion 72b in the rear face 72. Consequently, the glass substrate 1 formed with the lens part 72a can easily be bonded to the multilayer structure LS. Also, since the lens part 72a can be processed before bonding, the processing method is less restricted, which achieves a higher degree of freedom in designing the lens in terms of lens shape and the like.

The lens part 72a may also be formed after bonding the glass substrate 1 to the semiconductor substrate 51 which mounts the multilayer structure LS, etching stop layer 53, and film 10. In view of the degree of freedom in lens designs, however, it will be preferred if the glass substrate 1 formed with the lens part 72a in advance is bonded to the semiconductor substrate 51.

With reference to FIGS. 15 to 18, modified examples of this embodiment will now be explained. These modified examples relate to semiconductor light-emitting device arrays LE3 to LE6 each including a plurality of the arranged light-emitting parts 11. These light-emitting device arrays LE3 to LE6 are of so-called back emission type.

A plurality of light-emitting parts 11 are arranged one-dimensionally or two-dimensionally in the light-emitting device arrays LE3 to LE6 as shown in FIGS. 15 to 18, respectively. In the light-emitting device arrays LE3 and LE4, a light-emitting part 11 corresponding to a certain light-emitting region 11b and a pad electrode mounting part 31 corresponding to another adjacent light-emitting region 11b are integrated so as to yield one mesa structure. In the semiconductor light-emitting device arrays LE3 to LE6, the p-side pad electrodes 33 are electrically connected to each other.

The mechanical strength of the multilayer structure LS (laminated contact layer 3, first DBR layer 4, first cladding layer 5, active layer 6, second cladding layer 7, and second DBR layer 8) is secured by the glass substrate 1 in the light-emitting device arrays LE3 to LE6 as in the above-mentioned first and second embodiments. Also, since the pitch between the light-emitting parts 11 can be narrowed, the light-emitting device arrays LE3 to LE6 can easily be made small.

Figure 19:
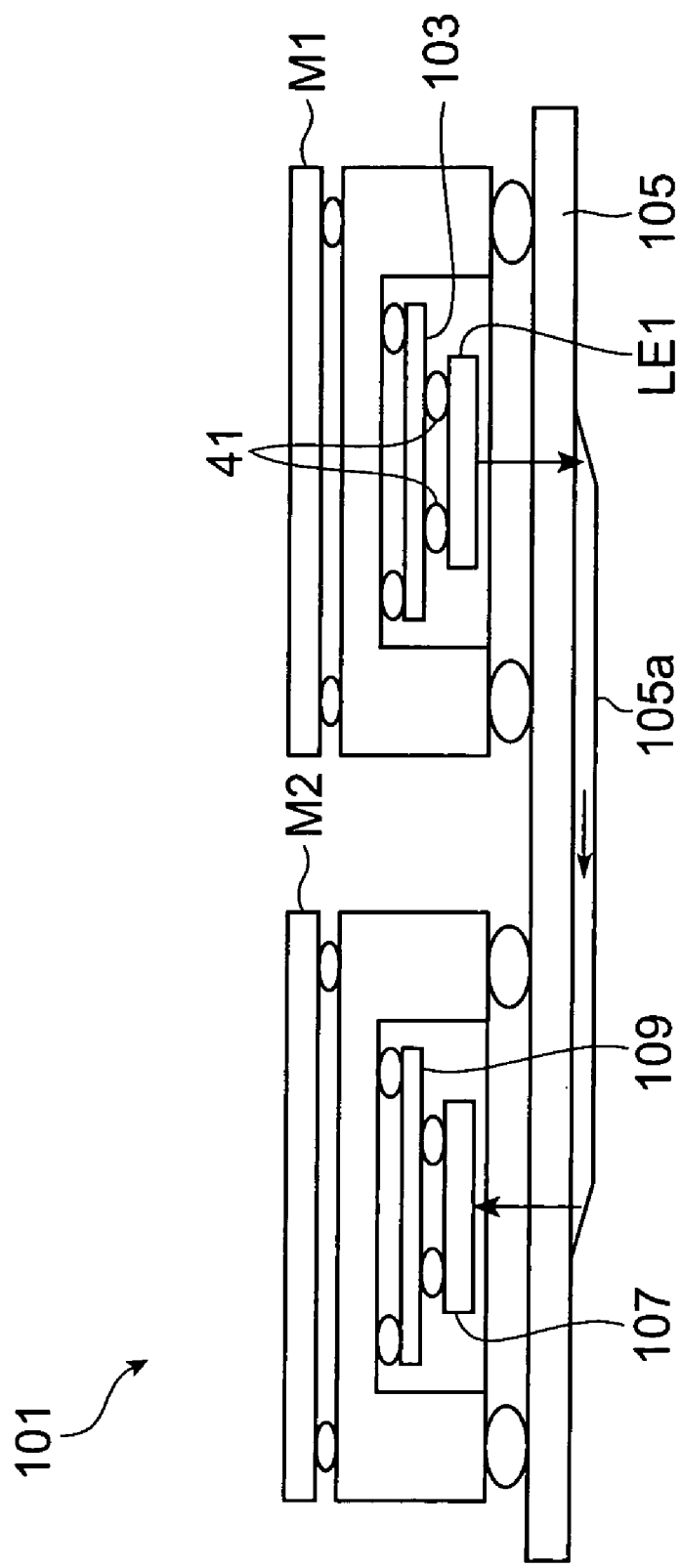
FIG. 19 is a schematic view showing the structure of an optical interconnection system in accordance with an embodiment of the present invention.

An optical interconnection system using the above-mentioned semiconductor light-emitting device (or semiconductor light-emitting device arrays) will now be explained with reference to FIG. 19. FIG. 19 is a schematic view showing the structure of the optical interconnection system.

The optical interconnection system 101 is a system which transmits optical signals between a plurality of modules (e.g., CPUs, integrated circuit chips, and memories) M1 and M2, and includes a semiconductor light-emitting device LE1, a driving circuit 103, an optical waveguide substrate 105, a semiconductor photodetecting device 107, an amplifier circuit 109, and the like. A photodetecting device of back entrance type can be used as the semiconductor photodetecting device 107. The module M1 is electrically connected to the driving circuit 103 through bump electrodes. The driving circuit 103 is electrically connected to the semiconductor light-emitting device LE1 through bump electrodes 41. The semiconductor photodetecting device 107 is electrically connected to the amplifier circuit 109 through bump electrodes. The amplifier circuit 109 is electrically connected to the module M2 through bump electrodes.

An electric signal outputted from the module M1 is sent to the driving circuit 103, and is converted into an optical signal by the semiconductor light-emitting device LE1. The optical signal from the semiconductor light-emitting device LE1 passes the optical waveguide 105a on the optical waveguide substrate 105, so as to enter the semiconductor photodetecting device 107. The optical signal is converted by the semiconductor photodetecting device 107 into an electric signal, which is then sent to the amplifier circuit 109 and amplified thereby. The amplified electric signal is sent to the module M2. Thus, the electric signal outputted from the module M1 is transmitted to the module M2.

The semiconductor light-emitting device LE2 or the semiconductor light-emitting device arrays LE3 to LE6 may be used instead of the semiconductor light-emitting device LE1. When the semiconductor light-emitting device arrays LE3 to LE6 are used, driving circuits 103, optical waveguide substrates 105, semiconductor photodetecting devices 107, and amplifier circuits 109 are also arranged so as to form an array.

Without being restricted to the above-mentioned embodiments, the present invention can be modified within a scope not deviating from the gist thereof. For example, thicknesses, materials, and the like of the contact layer 3, first DBR layer 4 (4a, 4b), first cladding layer 5 (5a, 5b), active layer 6 (6a, 6b), second cladding layer 7 (7a, 7b), second DBR layer 8 (8a, 8b), and the like are not limited to those mentioned above. Also, the configuration of the multilayer structure LS is not limited to those in the above-mentioned embodiments as long as it includes a plurality of laminated compound semiconductor layers.

Though the p-side pad electrode 33 is electrically connected to the contact layer 3 through the opening 13 formed between the light-emitting part 11 and the pad electrode mounting part 31, an opening may be formed separately from the opening 13, so that the p-side pad electrode 33 and the contact layer 3 are electrically connected to each other through this separate opening.

From the invention thus described, it will be obvious that the embodiments of the present invention may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

The present invention can provide a semiconductor light-emitting device having a sufficient mechanical strength and being able to be made small, and a method of manufacturing the same.

The invention claimed is:

1. A semiconductor light-emitting device comprising a multilayer structure, the multilayer structure including a plurality of compound semiconductor layers laminated and the multilayer structure generating light;
the multilayer structure having a light exit face for emitting the generated light, a glass substrate optically transparent to the light being fixed to the light exit face by way of a film made of silicon oxide;
wherein the multilayer structure includes a first distributed Bragg reflector (DBR) layer of a first conductive type, a first cladding layer of the first conductive type, an active layer, a second cladding layer of a second conductive type, and a second DBR layer of the second conductive type sequentially laminated as the plurality of compound semiconductor layers;
wherein the multilayer structure has a multilayer region partially including the first DBR layer, first cladding layer, active layer, second cladding layer, and second DBR layer; and an insulated or semi-insulated current-narrowing region surrounding the multilayer region;
wherein the first DBR layer is arranged between the first cladding layer and the film made of silicon oxide;
wherein the multilayer structure further comprises a contact layer of the first conductive type positioned between the film made of silicon oxide and the first DBR layer;
wherein the multilayer structure has;
a light-emitting part including the multilayer region; and
a pad electrode mounting part partially including the first DBR layer, first cladding layer, active layer, second cladding layer, and second DBR layer;
the semiconductor light-emitting device further comprising:
a first pad electrode arranged on the light-emitting part and electrically connected to the multilayer region; and
a second pad electrode arranged on the pad electrode mounting part and electrically connected to the contact layer,
wherein the second pad electrode is electrically connected to the contact layer through an opening formed between the light-emitting part and the pad electrode mounting part.

2. A semiconductor light-emitting device according to claim 1, further comprising respective bump electrodes arranged on the first and second pad electrodes.

3. A semiconductor light-emitting device according to claim 1, wherein the multilayer structure has a plurality of the arranged light-emitting parts.

4. A semiconductor light-emitting device according to claim 1, further comprising a light-reflecting film disposed on the second DBR layer, the light-reflecting film covering the multilayer region.

5. A semiconductor light-emitting device according to claim 1, wherein the glass substrate has front and rear faces;
wherein the front face of the glass substrate is in contact with the film made of silicon oxide; and
wherein the rear face of the glass substrate has a lens part for receiving the light emitted from the multilayer structure.

6. A semiconductor light-emitting device according to claim 5, wherein the lens part is depressed from the most raised portion in the rear face of the glass substrate.

* * * * *